(12) United States Patent
Tsai et al.

(10) Patent No.: US 9,385,156 B2
(45) Date of Patent: Jul. 5, 2016

(54) METHOD OF MANUFACTURING A BACK SIDE ILLUMINATED (BSI) IMAGE SENSOR

(71) Applicant: TAIWAN SEMICONDUCTOR MANUFACTURING COMPANY LTD., Hsinchu (TW)

(72) Inventors: Tsung-Han Tsai, Miaoli County (TW); Yun-Wei Cheng, Taipei (TW); Kuo-Cheng Lee, Tainan (TW); Chun-Hao Chou, Tainan (TW); Yung-Lung Hsu, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/554,629

(22) Filed: Nov. 26, 2014

(65) Prior Publication Data

US 2016/0148969 A1    May 26, 2016

(51) Int. Cl.
*H01L 31/062* (2012.01)
*H01L 31/113* (2006.01)
*H01L 27/146* (2006.01)

(52) U.S. Cl.
CPC ...... *H01L 27/14645* (2013.01); *H01L 27/1463* (2013.01); *H01L 27/1464* (2013.01); *H01L 27/14612* (2013.01); *H01L 27/14621* (2013.01); *H01L 27/14636* (2013.01); *H01L 27/14685* (2013.01); *H01L 27/14689* (2013.01)

(58) Field of Classification Search
CPC ............... H01L 31/062; H01L 31/113; H01L 27/14609; H01L 27/1463; H01L 27/14689
USPC ..................... 257/292, 432; 438/71
See application file for complete search history.

(56) References Cited

U.S. PATENT DOCUMENTS

| | | | |
|---|---|---|---|
| 2008/0128846 A1* | 6/2008 | Bui ...................... | B23K 1/0016 257/437 |
| 2009/0184339 A1* | 7/2009 | Tashibu ............. | H01L 21/76264 257/139 |
| 2011/0169991 A1* | 7/2011 | Ku .................... | H01L 27/14607 348/308 |
| 2013/0023111 A1* | 1/2013 | Purtell ............. | H01L 21/02381 438/486 |
| 2014/0004690 A1* | 1/2014 | Isogai ................ | H01L 21/3003 438/586 |
| 2015/0028442 A1* | 1/2015 | Miyanami ......... | H01L 27/14623 257/435 |
| 2015/0035048 A1* | 2/2015 | Weber ................ | H01L 29/1037 257/329 |

* cited by examiner

*Primary Examiner* — Phuc Dang
(74) *Attorney, Agent, or Firm* — WPAT, P.C. Intellectual Property Attorneys; Anthony King

(57) ABSTRACT

Some embodiments of the present disclosure provide a method of manufacturing a back side illuminated (BSI) image sensor. The method includes receiving a semiconductive substrate; forming a transistor coupled to a photosensitive element at a front side of the semiconductive substrate; forming a deep trench isolation (DTI) at a back side of the semiconductive substrate; forming a doped layer conformally over the DTI; performing a microwave anneal over the back side; forming a non-transparent material inside the DTI; and forming a color filter over the doped layer.

18 Claims, 33 Drawing Sheets

METHOD OF MANUFACTURING A BACK SIDE ILLUMINATED (BSI) IMAGE SENSOR

FIELD

The present disclosure relates to a method of manufacturing a back side illuminated (BSI) image sensor.

BACKGROUND

Image sensors are widely used in various imaging applications and products, such as cameras, scanners, photocopiers, etc. A performance of an image sensor is depended on a dark current.

The dark current occurs when some electric current flows through the image sensor even no photons are entering the image sensor. The dark current is one of sources for noise in the image sensors. The dark current is referred to as a leakage current in non-optical devices such as in transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
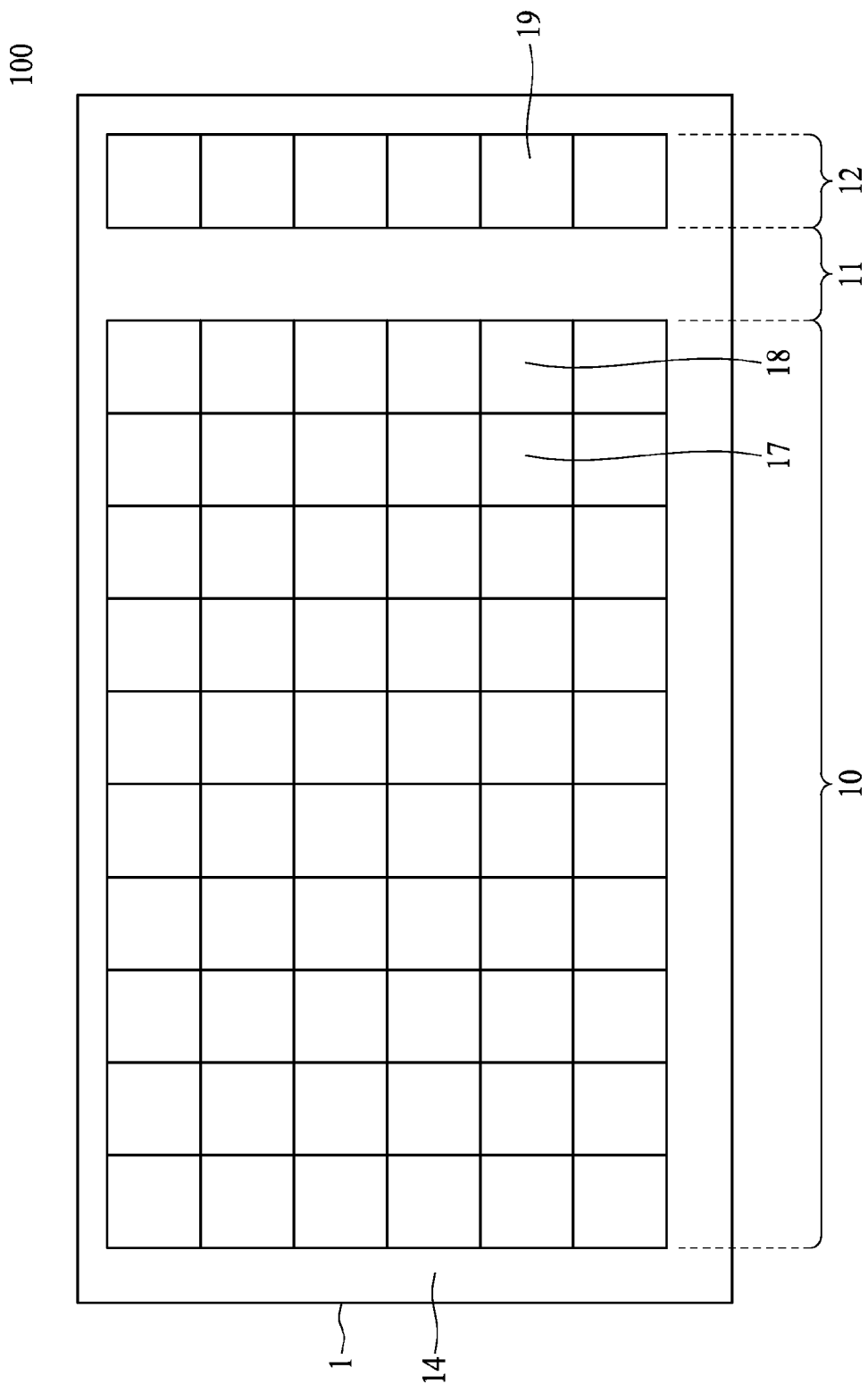
FIG. 1 is a plan view of an image sensor with some pixels, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In FIG. 1, an image sensor 100 is illustrated. FIG. 1 is a schematic plan view of an image sensor 100 in accordance with some embodiments. The image sensor 100 includes a semiconductive substrate 1. The semiconductive substrate 1 includes a pixel array region 10 and a logic region 14 outside the pixel array region 10. The pixel array region 10 includes one or more pixel regions 17 and 18 arranged therein in a pixel array. The pixel regions 17 and 18 are configured to convert light to image data. In some embodiments, the pixel array region 10 includes complementary metal-oxide-semiconductor (CMOS), and the image sensor 100 is a CMOS image sensor (CIS). In some embodiments, the pixel regions 17 and 18 are charged coupled device (CCD) image sensors. In some embodiments, the pixel regions 17 and 18 are monochromatic pixels. In some other embodiments, the pixel regions 17 and 18 are color pixels such as blue (B), green (G), or red (R) pixels configured to detect different colors in an incident light. The image sensor 100 further includes one or more black level reference pixels 19 arranged in a black level reference pixel array 12. The black level reference pixels 19 are similar or identical to the pixel regions 17 and 18, except that light is blocked to prevent the black level reference pixels 19 from receiving light. Image data outputted by the black level reference pixels 19 provides a black level that is referenced for calibrating the image sensor 100. In some embodiments, the black level reference pixels 19 are omitted.

Figure 2:
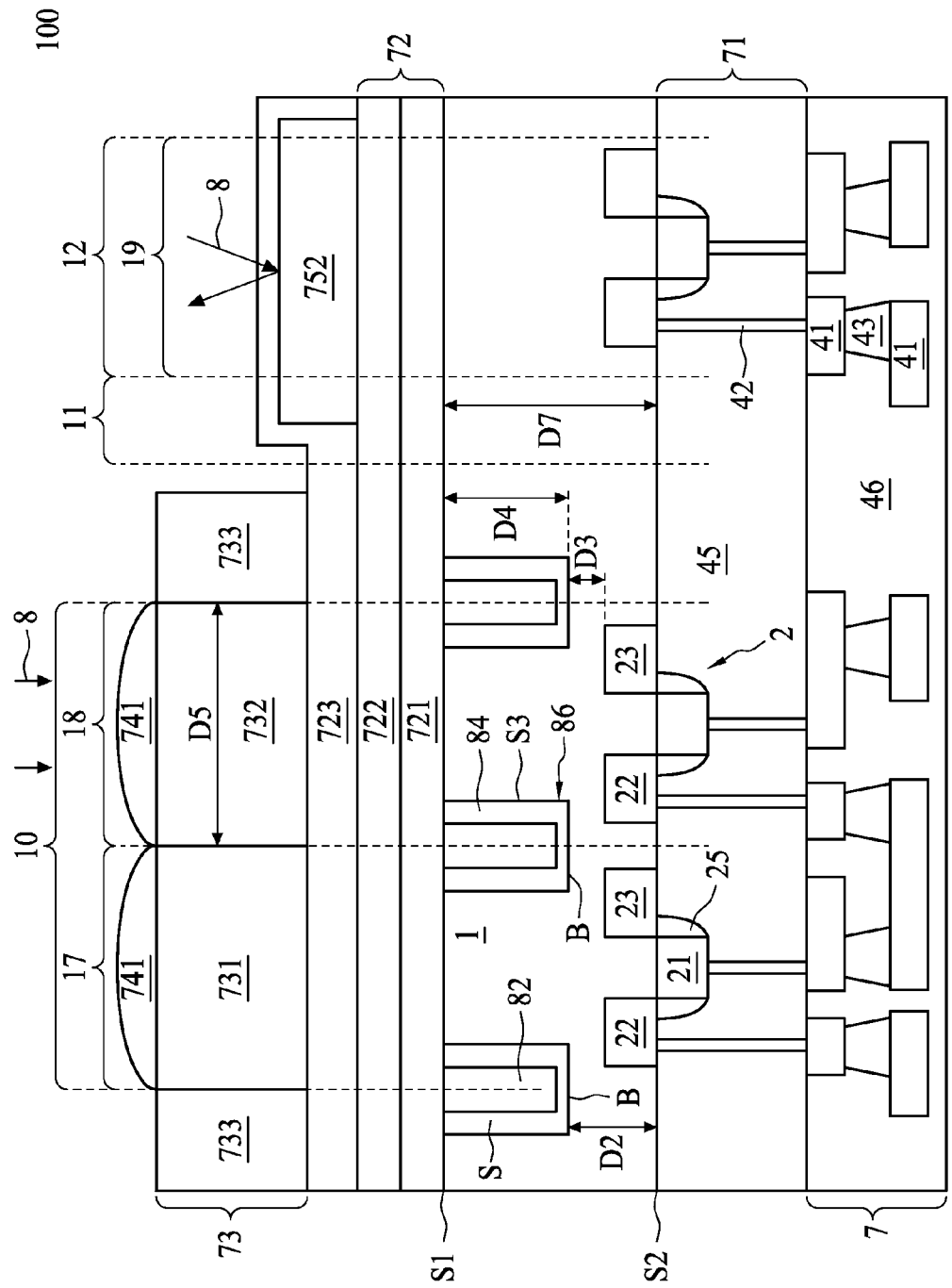
FIG. 2 is a cross-sectional view of an image sensor, in accordance with some embodiments of the present disclosure.

FIG. 2 is a cross sectional view of image sensor 100. In some embodiments, the image sensor 100 is a back side illuminated (BSI) image sensor. The image sensor 100 includes the pixel array region 10, buffer region 11, and black level reference pixel array 12.

Pixel array region 10 includes pixel region 17 and pixel region 18. The pixel regions 17 and 18 are separated by deep trench isolation DTI 86. Each pixel region 17 or 18 includes a transistor 2. The transistor 2 includes a gate structure 21, a gate spacer 25, a photosensitive element 22, and a photosensitive element 23. Pixel region 17 and pixel region 18 are defined by the deep trench isolations 86 at a boundary of pixel region 17 or 18. Semiconductive substrate 1 includes deep trench isolation (DTI) 86 at a back side S1 of the semiconductive substrate 1. DTI 86 is under back side S1. A top surface of DTI 86 is coplanar with back side S1.

Buffer region 11 is between pixel array region 10 and black level reference pixel array 12. Buffer region 11 is separating pixel array region 10 from black level reference pixel array 12 by a predetermined distance.

Black level reference pixel 19 is structured in black level reference pixel array 12. A light shielding layer 752 is under the capping layer 723. Light shielding layer 752 prevents incident light 8 reaching the light shielding layer 752 from transmitting to the photosensitive element 22 or 23. The photosensitive element 22 or 23 is coupled with the transistor 2. The black level reference pixel 19 is configured to output image data from the transistor 2 to a logic transistor (not shown) through the contacts 42 and the interconnection 41.

Image sensor 100 includes multilayer structure 72 above semiconductive substrate 1. Color filter array 73 is above multilayer structure 72. Microlenses 741 are above color filter array 73. Image sensor 100 includes interlayer dielectric (ILD) layer 71 below semiconductive substrate 1. Redistribution layer 7 is below ILD layer 71.

The multilayer structure 72 includes a first transmitting layer 721, a second transmitting layer 722, and a capping layer 723. The multilayer structure 72 is disposed at the back side S1 of the semiconductive substrate 1.

In some embodiments, the pixel array region 10 includes color filter 731, 732, or 733 in color filter array 73 disposed proximate to back side S1 of the semiconductive substrate 1. The back side S1 is opposite of the front side S2. In some other embodiments, the multilayer structure 72 is arranged with an increasing refractive index from air outside the image sensor 100 to the semiconductive substrate 1. For example, color filter array 73 includes lower refractive index than a material in an underlying multilayer structure 72. Microlenses 741 include lower refractive index than a material in an underlying color filter array 73.

In an embodiment, the semiconductive substrate 1 is made from silicon. The semiconductive substrate 1 includes bulk silicon, a semiconductor wafer, a silicon-on-insulator (SOI) substrate, or a silicon germanium substrate. Other semiconductor materials including group III, group IV, and group V elements are used in some embodiments. The semiconductive substrate 1 is undoped in some embodiments. In some other embodiments, the semiconductive substrate 1 is doped with a p-type dopant or an n-type dopant. Back side S1 is at a top of the semiconductive substrate 1. Front side S2 is at a bottom of the semiconductive substrate 1.

Doped layer 84 is under the back side S1 of the semiconductive substrate 1. Doped layer 84 is within DTI 86. Doped layer 84 is in contact with a side S3 of the DTI 86. Side S3 is at an outer edge of DTI 86. In some embodiments, side S3 of DTI 86 is substantially vertical. In some other embodiments, side S3 is tilted with respect to back side S1. Back side S1 is an interface between doped layer 84 and multilayer structure 72. Non-transparent material 82 is in the DTI 86 border with doped layer 84. Non-transparent material 82 is in contact with multilayer structure 72 at back side S1. A top surface of non-transparent material 82 and a top surface of doped layer 84 are coplanar with each other.

Non-transparent material 82 serves as an optical isolation to separate pixel regions 17 and 18 such that light would keep within each individual pixel region 17 or 18. In some embodiments, non-transparent material 82 is made of a conductive material. The conductive material is configured to reflect light. In some embodiments, non-transparent material 82 is made of conductive materials such as aluminum, copper, titanium nitride, tungsten, titanium, tantalum, tantalum nitride, nickel silicide, cobalt silicide, other suitable materials, and/or combinations thereof. The Non-transparent material 82 functions to prevent light from one pixel region 17 makes its way into an adjacent pixel region 18, thereby causing the adjacent pixel region 18 to sense the light by transistor 2.

In some embodiments, DTI 86 is replaced by a shallow trench isolation (STI) features or a local oxidation of silicon (LOCOS) features. The DTI 86 defines and isolates various elements or regions from each other in the semiconductive substrate 1. For example, the DTI 86 isolates adjacent pixel region 17 or 18 from each other, the pixel array region 10 from black level reference pixel 19, or some components of the circuitry inside a logic region from each other etc. In some embodiments, DTI 86 is made of a dielectric material or insulator materials such as silicon oxide, silicon nitride, or silicon oxynitride. In some embodiments, the DTI 86 is a multi-layer structure including layer such as a thermal oxide liner layer with silicon nitride or silicon oxide inside the thermal oxide liner layer. In some embodiments, non-transparent material 82 includes the silicon nitride or silicon oxide.

In FIG. 2, semiconductive substrate 1 includes photosensitive element 22 and photosensitive element 23 of a transistor 2 at a front side S2 of the semiconductive substrate 1. Photosensitive element 22 and photosensitive element 23 are above the front side S2 within semiconductive substrate 1.

In some embodiments, the photosensitive element 22 or the photosensitive element 23 are a drain region or a source region. In some embodiments, photosensitive element 22 or 23 is replaces by a doped drain or source region. Photosensitive element 22 or 23 is configured to receive light 8 (B, G or R). The light 8 is incident upon a microlens 741, transmitted through color filter array 73 and a multilayer structure 72, and traveled toward the back side S1 into the semiconductive substrate 1. The light 8 is then converted by the photosensitive element 22 or 23 into image data.

Transistor 2 is connected with the photosensitive element 22 or 23 at a front side S2 of the semiconductive substrate 1. Transistor 2 includes a gate structure 21 and gate spacer 25 below front side S2. An interconnection 41 coupled with the transistor 2 through a contact 42. In some embodiments, the transistor 2 is a transfer transistor for transferring the image data captured by a corresponding photosensitive element 22 or 23 to external circuitry. In some embodiments, additional transistors with various functions are also included in each pixel array region 10. For example, a reset transistor, a source follower transistor, and/or a select transistor are included in each pixel array region 10 to define together with the transfer transistor a four-transistor CIS. Other CIS arrangements are suitable in some embodiments. The principles described herein are also applicable to CCD pixels in further embodiments. In some embodiments, other transistors in pixel array region 10 are structured similarly to the transistor 2.

An interlayer dielectric (ILD) layer 71 includes contact 42. The ILD layer 71 is at front side S2. ILD layer 71 is below semiconductive substrate 1. ILD layer 71 includes dielectric layer 45 below front side S2. Contacts 42 are buried inside dielectric layer 45. Contacts 42 are connected with gate structure 21, photosensitive element 22, or photosensitive element 23 of transistor 2.

Contacts 42 are connected to interconnection 41 in a redistribution layer. Redistribution layer 7 is over the dielectric layer 45 and the contacts 42 in the ILD layer 71. The redistribution layer 7 includes an interconnection 41 coupled with the contacts 42. The redistribution layer 7 includes alternating some conductive layers and some dielectric layers 46. The conductive layers are patterned and/or otherwise processed to form the interconnections 41 coupled to some devices (e.g., the transistors 2) and/or between the devices and some external circuitries. The interconnections 41 are coupled to the devices through the contacts 42. The interconnection 41 is coupled to another interconnection 41 in other layer through a via 43.

The contacts 42 are disposed in the dielectric layer 45. Contacts 42 and dielectric layer 45 are in the pixel array region 10 and the black level reference pixel array 12. The ILD layer 71 includes the contacts 42 and the dielectric layer 45. Contacts 42 are connected to photosensitive element 22 or 23 at front side S2. Contacts 42 are connected to interconnection 41 at an interface between ILD layer 71 and redistribution layer 7. The inter-layer dielectric (ILD) layer 71 is under the front side S2 of the semiconductive substrate 1. The ILD layer 71 includes dielectric layer 45 made of material such as, boron phosphorous silicate glass (BPSG), plasma enhanced tetra-ethyl-ortho-silicate (PE-TEOS), or any other suitable dielectric materials. In some embodiments, contact 42 is made of conductive materials such as aluminum, copper, titanium nitride, tungsten, titanium, tantalum, tantalum nitride, nickel silicide, cobalt silicide, TaC, TaSiN, TaCN, TiAl, TiAlN, other suitable materials, and/or combinations thereof.

Figure 3:
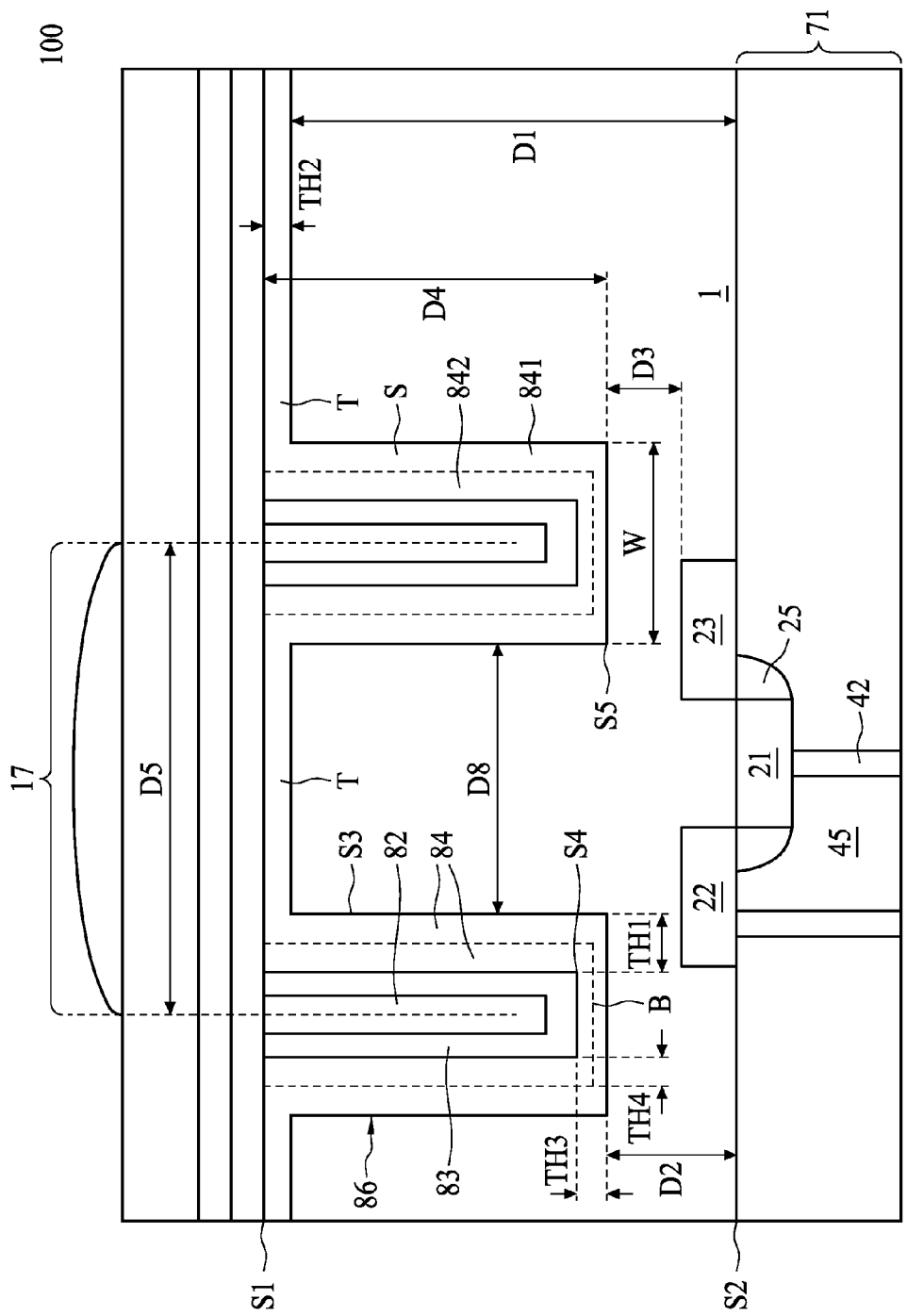
FIG. 3 is a cross-sectional view of an image sensor, in accordance with some embodiments.

FIG. 3 illustrates another embodiment of the present disclosure. The doped layer 84 includes top portion T, side portion S, and bottom portion B. In FIG. 2, doped layer 84 includes side portion S and bottom portion B, but does not include top portion T. In FIG. 3, a dielectric layer 83 is in between doped layer 84 and non-transparent layer 82. In FIG. 2, doped layer 84 is in contact with non-transparent layer 82 without dielectric layer 83 between them.

In FIG. 3, DTI 86 includes bottom side S5 positioned at a distance D3 from photosensitive element 22 or 23. Distance D3 is a shortest distance measured vertically from bottom side S5 to a top of photosensitive element 22 or 23. A depth D4 of DTI is measured from back side S1 to bottom side S5 of DTI 86. DTI 86 includes a predetermined distance D5 apart from each other. Predetermined distance D5 is measured from a center of DTI 86 to another center of a neighboring DTI 86. Predetermined distance D5 is a length of a pixel region 17. A width W of DTI 86 is measured from one side S3 of a DTI 86 to another side S3 of the same DTI 86. A distance D8 is measured from one side S3 of a DTI 86 to another side S3 of a neighboring DTI 86. An aspect ratio of DTI 86 is a ratio between depth D4 and width W.

Doped layer 84 includes bottom side S5 disposed at a distance D2 from the front side S2. Distance D1 is measured from front side S2 to the lower side of top portion T of doped layer 84. Vertical thickness TH2 is a thickness of a top portion T. Vertical thickness TH2 is measured vertically from back side S1 to a lower side of top portion T of doped layer 84. A ratio between a vertical thickness TH2 of the doped layer 84 and distance D1 is a first distance ratio. A ratio between a vertical thickness TH3 of bottom portion B of the doped layer 84 and distance D2 is a second distance ratio. Distance D2 and distance D1 are defining how far doped layer 84 is away from ILD layer 71. Top portion T of doped layer 84 is proximate to the back side S1. In some embodiments, top portion T is between a DTI 86 and a neighboring DTI 86. Top portion T is overlying horizontally between multilayer structure 72 and semiconductive substrate 1.

In FIG. 3, doped layer 84 includes a side portion S. Side portion S is vertically lined against a side S3 of DTI 86. Side portion S includes a horizontal thickness TH1. Horizontal thickness TH1 is a thickness of a side portion S of doped layer 84. Horizontal thickness TH1 is measured horizontally from a side S3 of DTI 86 to inner side S4 of doped layer 84. Doped layer 84 includes a ratio of a vertical thickness TH2 of the doped layer 84 to a horizontal thickness TH1 of the doped layer 84. In some embodiments, the ratio is substantially more than 1. For example, vertical thickness TH2 of top portion T is substantially greater than horizontal thickness TH1 of side portion S. Vertical thickness TH3 is a thickness of a bottom portion B of doped layer 84. Vertical thickness TH3 is measured vertically from bottom side S5 to an inner side S4 of doped layer 84. In some embodiments, vertical thickness TH3 of bottom portion B is substantially the same with vertical thickness TH2 of top portion T.

Doped layer 84 includes a p-type dopant or an n-type dopant. Doped layer 84 includes a doping profile. The doping profile includes a variable doping concentration in doped layer 84. For example, doped layer 84 includes a gradient in a doping concentration of a p-type dopant. The doping concentration of the p-type dopant increases linearly from side S3 to inner side S4. In some embodiments, doped layer 84 includes variable doped region 842 and 841. Doped region 842 and 841 include different doping type or doping concentration. For example, a dopant for doped region 842 includes p-type dopant, while dopant for doped region 841 includes n-type dopant. Doping concentrations are different for doped region 842 and 841. For example, a doping concentration in doped region 842 is substantially higher than a doping concentration in doped region 841. The doping concentration is uniform or gradient within doped region 842 or 841. In some embodiments, a variable concentration of a doping profile is changing sharply from inner side S4 to side S3. In some embodiments, a doping profile is changing gradually from inner side S4 to bottom side S5. In some embodiments, doped layer 84 includes more than two doped regions.

In some embodiments, dielectric layer 83 is optionally disposed conformally over the doped layer 84. Dielectric layer 83 is lined against inner side S4 of doped layer 84. Dielectric layer 83 is in DTI 86. In some embodiments, dielectric layer 83 is a polarized dielectric layer. Dielectric layer 83 is border on side portion S and bottom portion B of doped layer 84. Dielectric layer 83 is made of insulator materials such as silicon oxide, silicon nitride, or silicon oxynitride.

Figure 4:
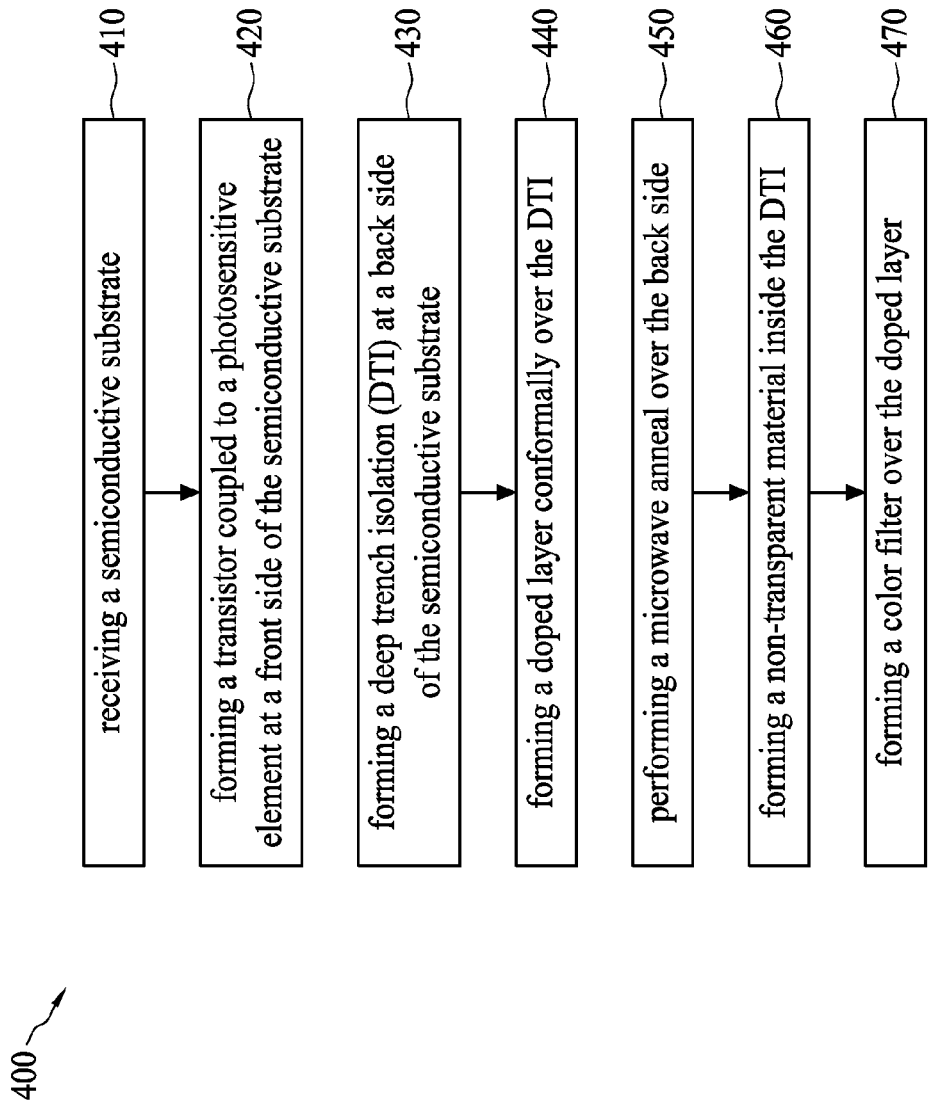
FIG. 4 is an operational flow of a method for manufacturing an image sensor, in accordance with some embodiments.
Figure 6:
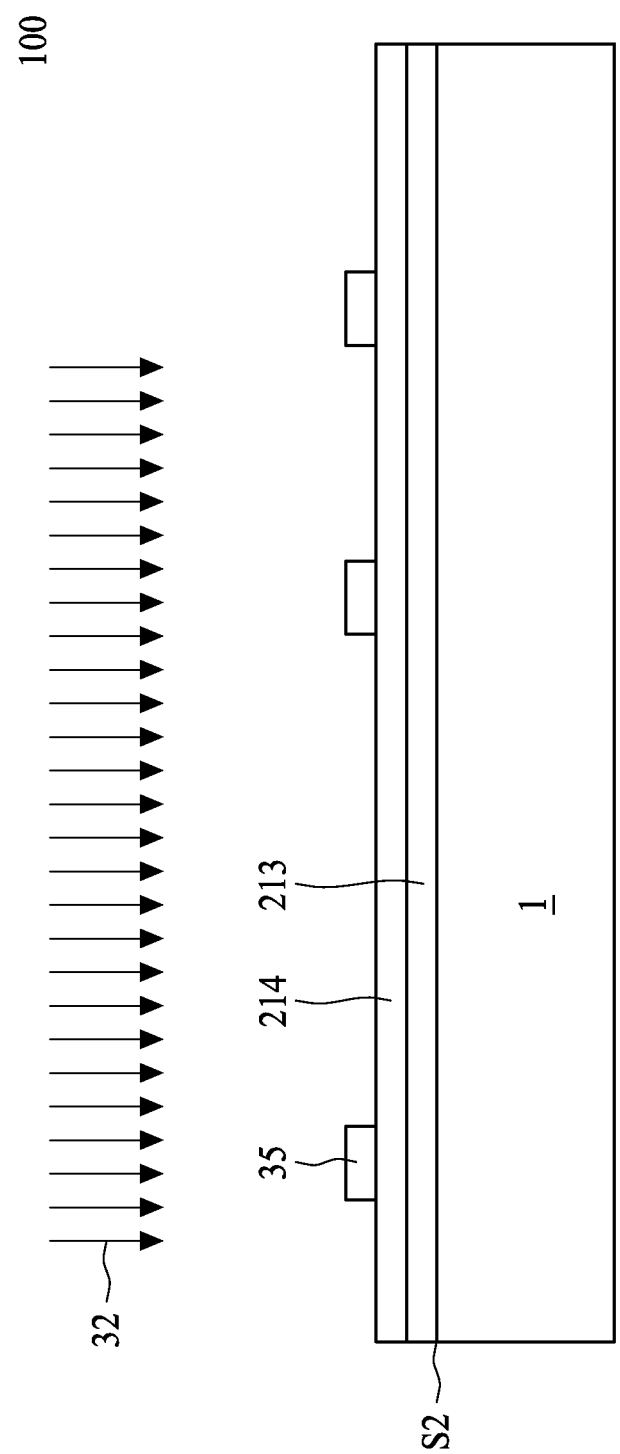
FIGS. 6 to 33 are cross sectional views of an operation in a method for manufacturing an image sensor, in accordance with some embodiments.
Figure 7:
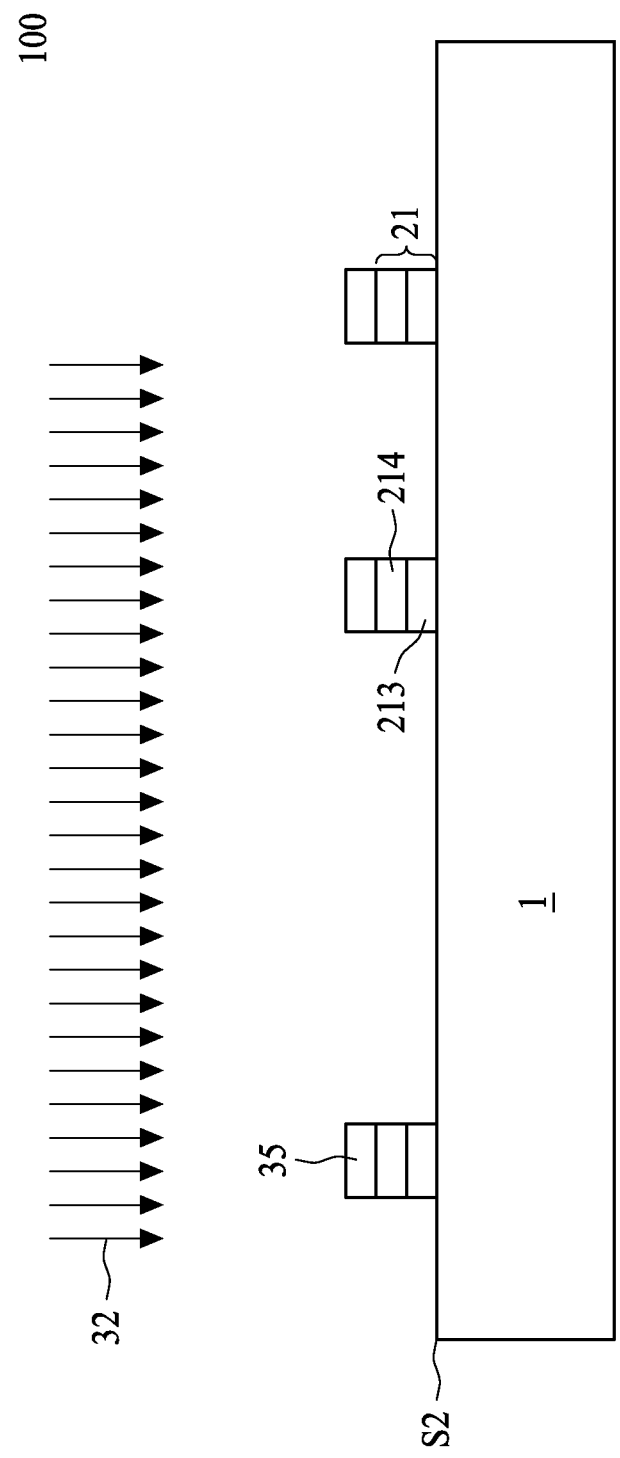
Figure 8:
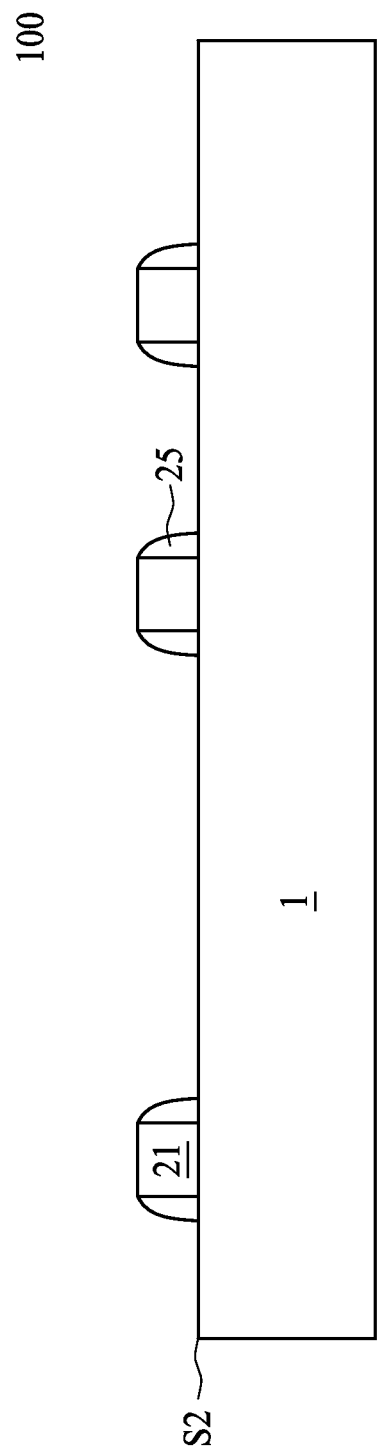
Figure 9:
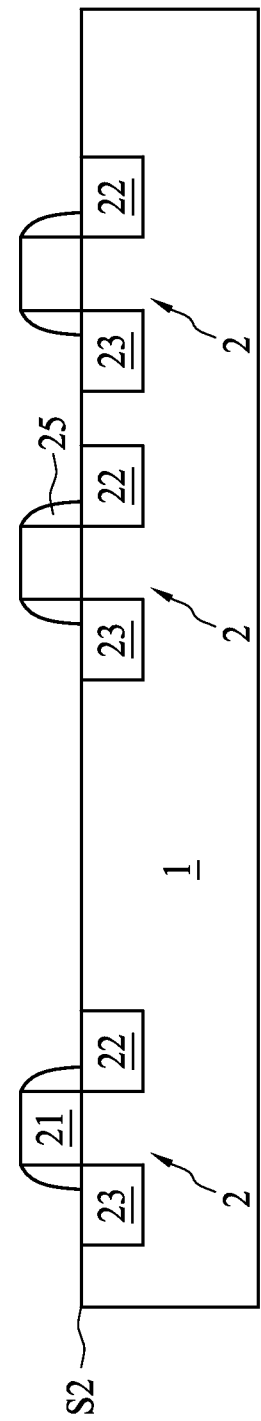
Figure 16:
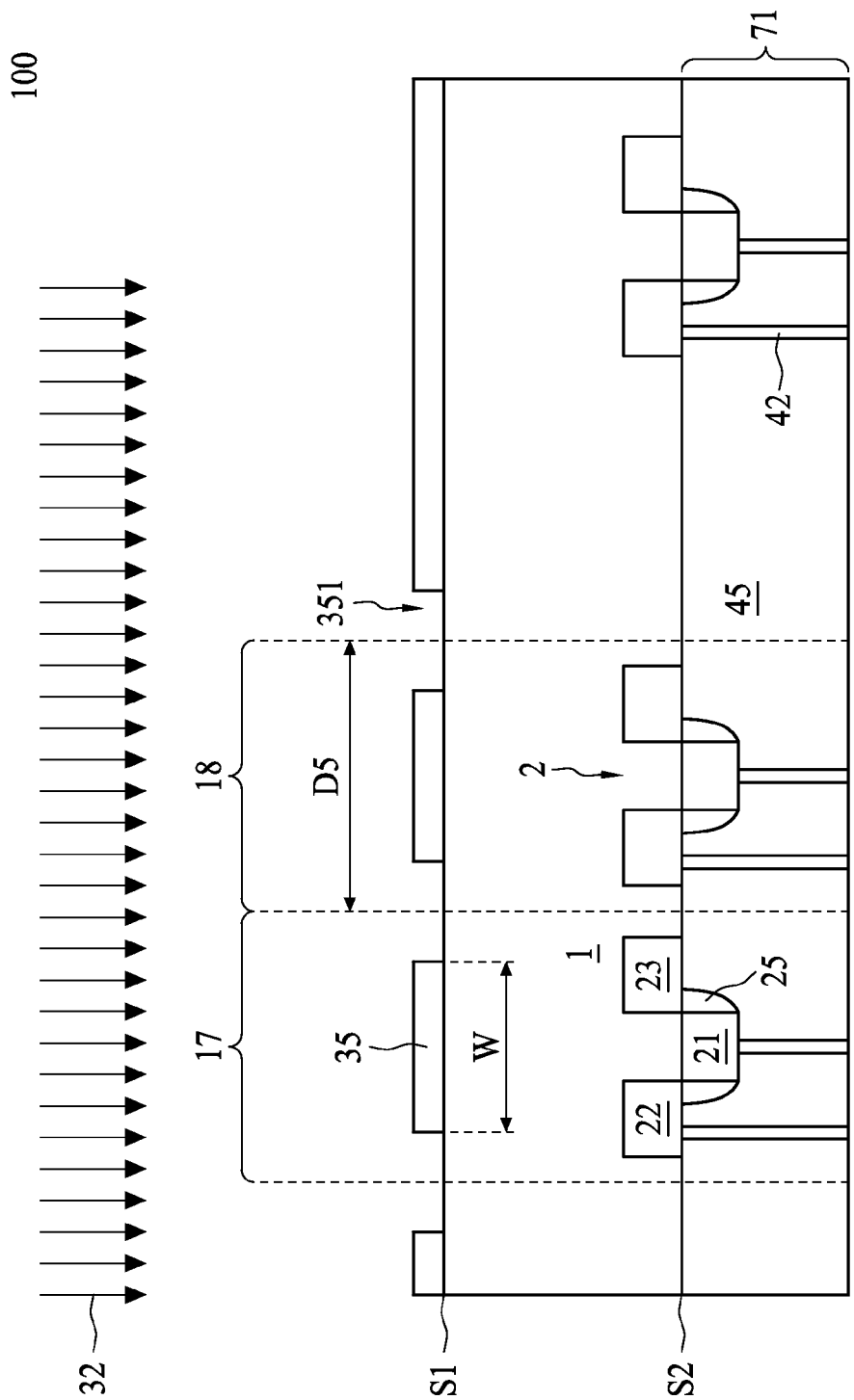
Figure 17:
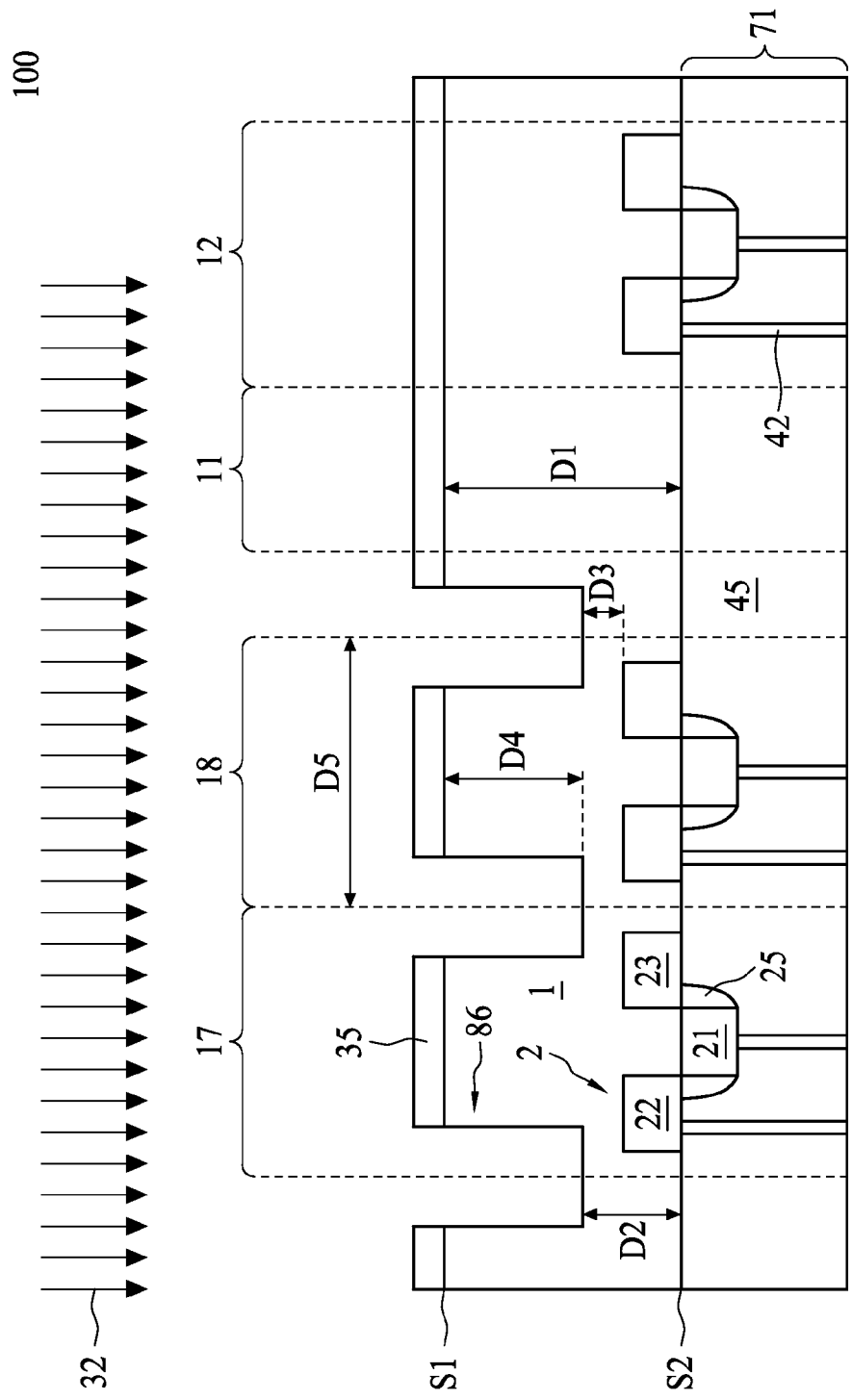
Figure 18:
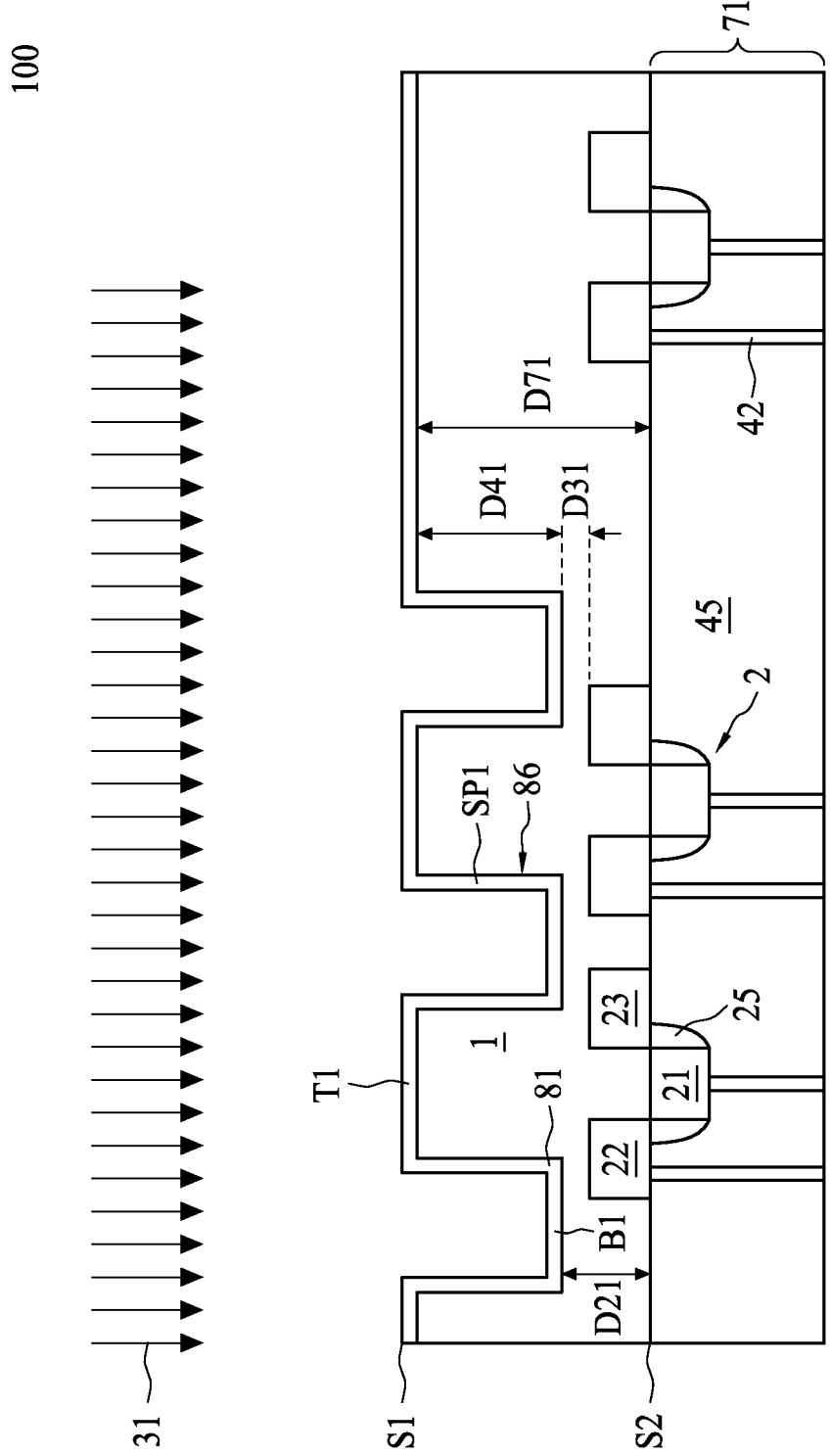
Figure 19:
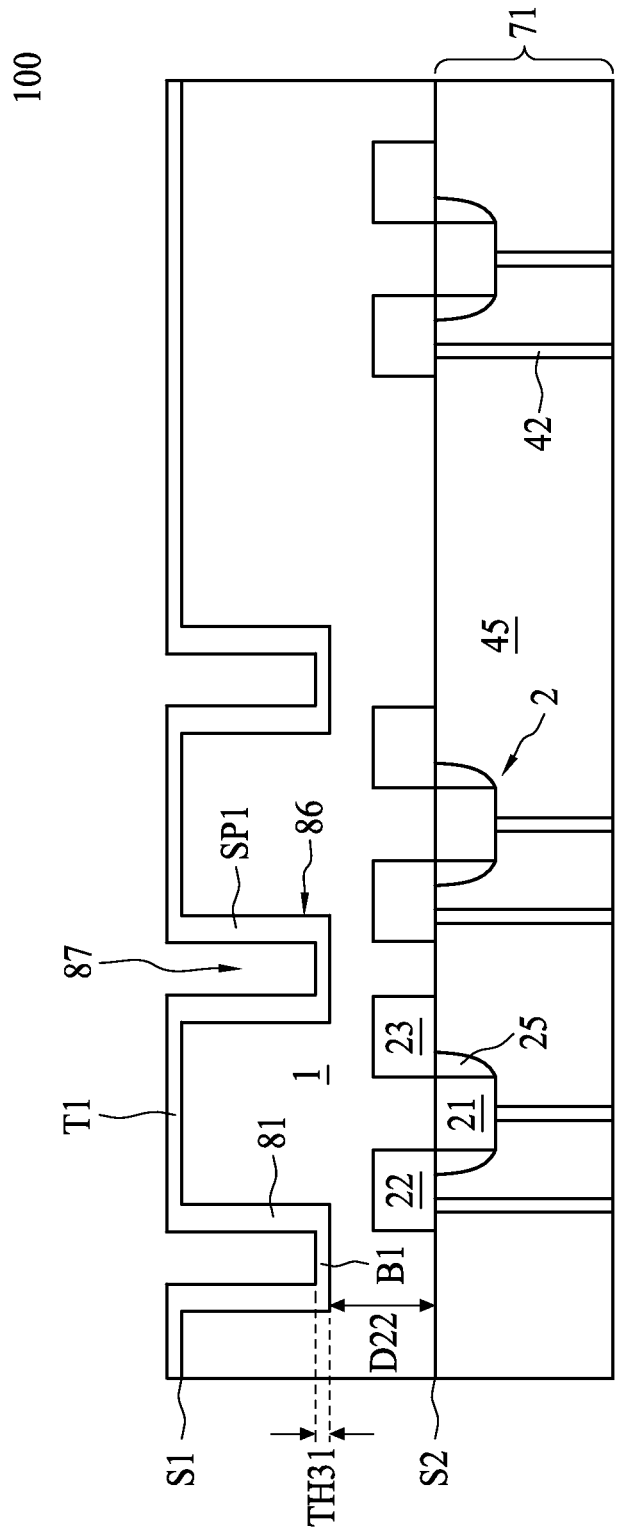
Figure 20:
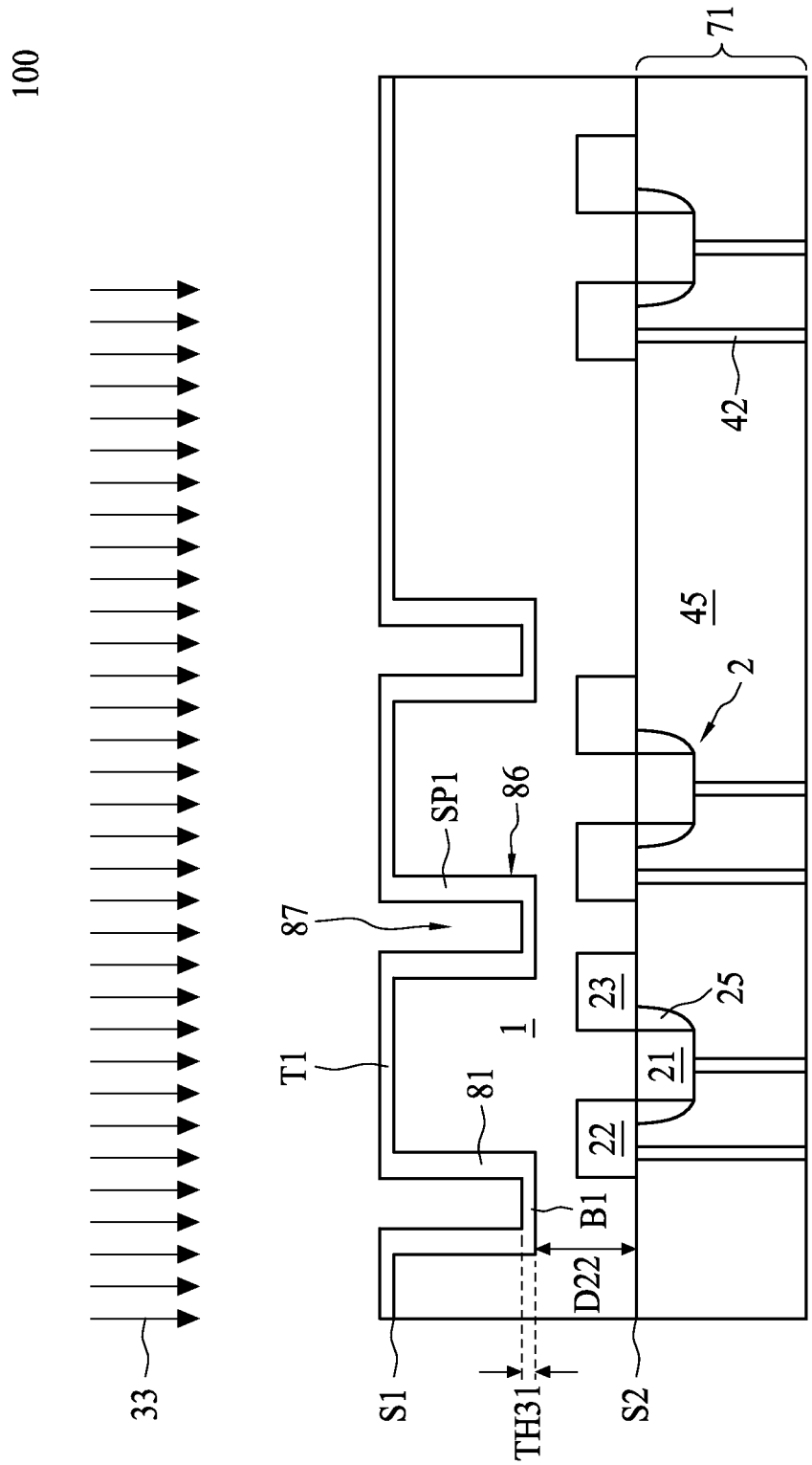
Figure 21:
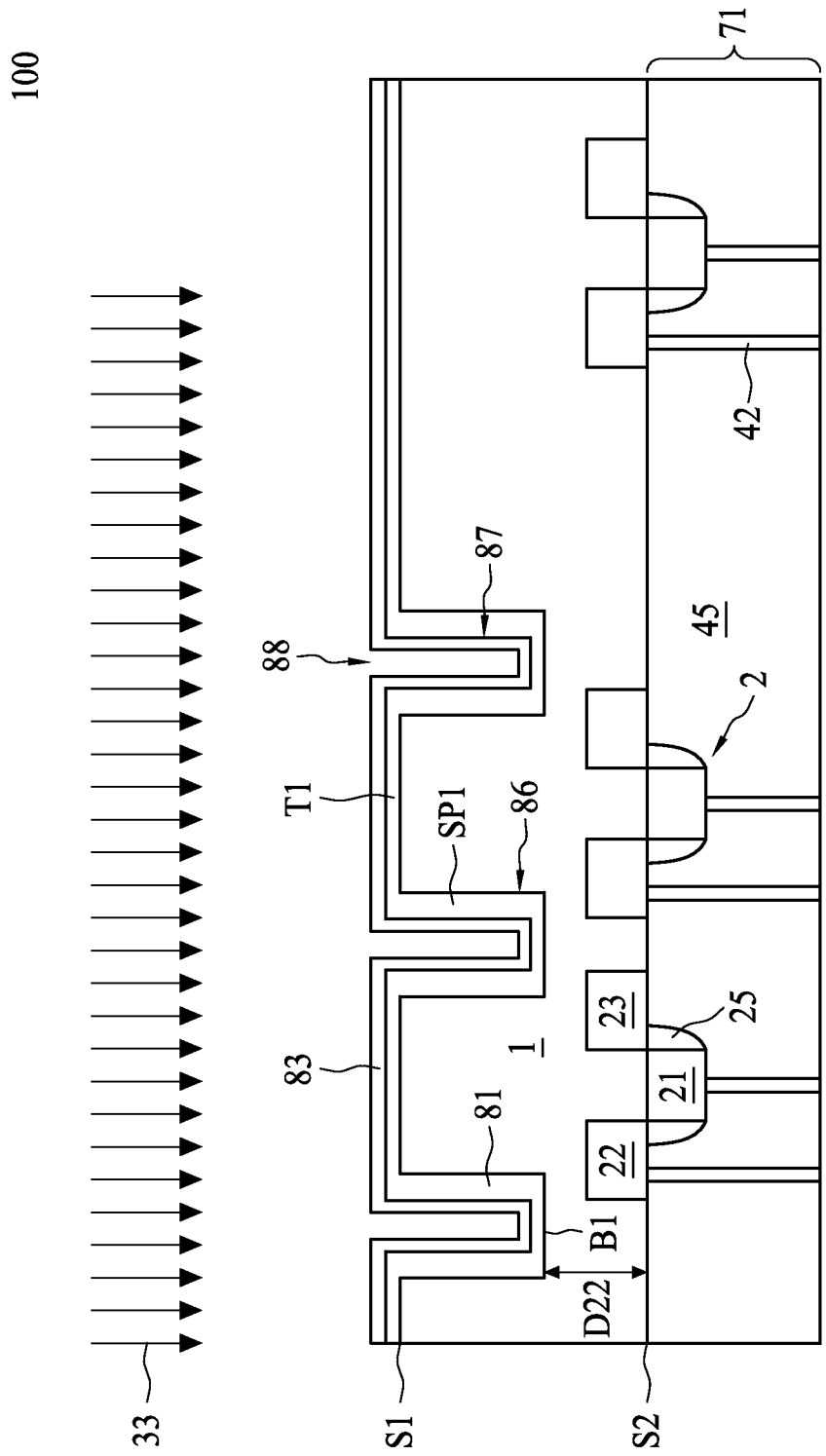
Figure 22:
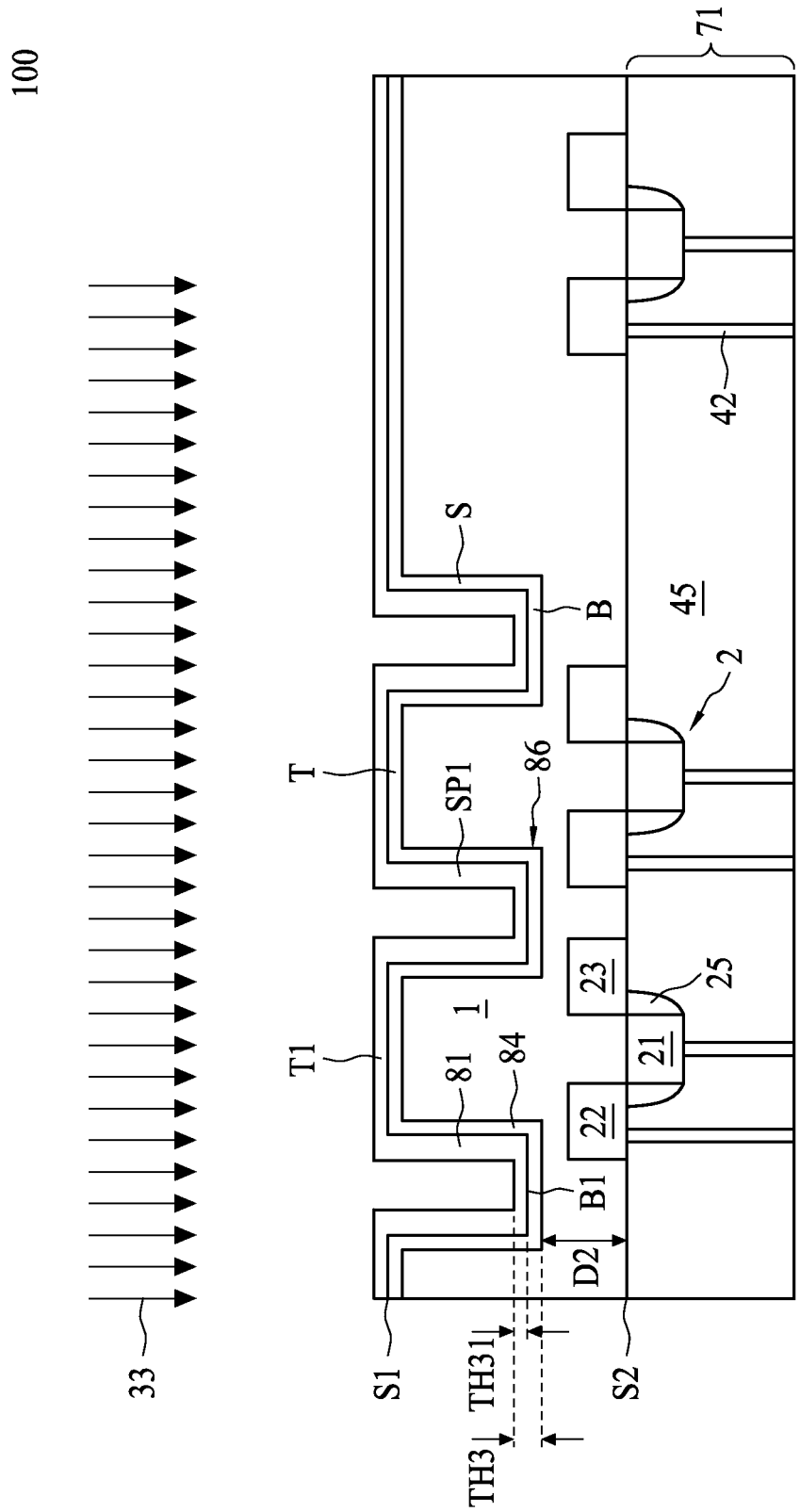
Figure 24:
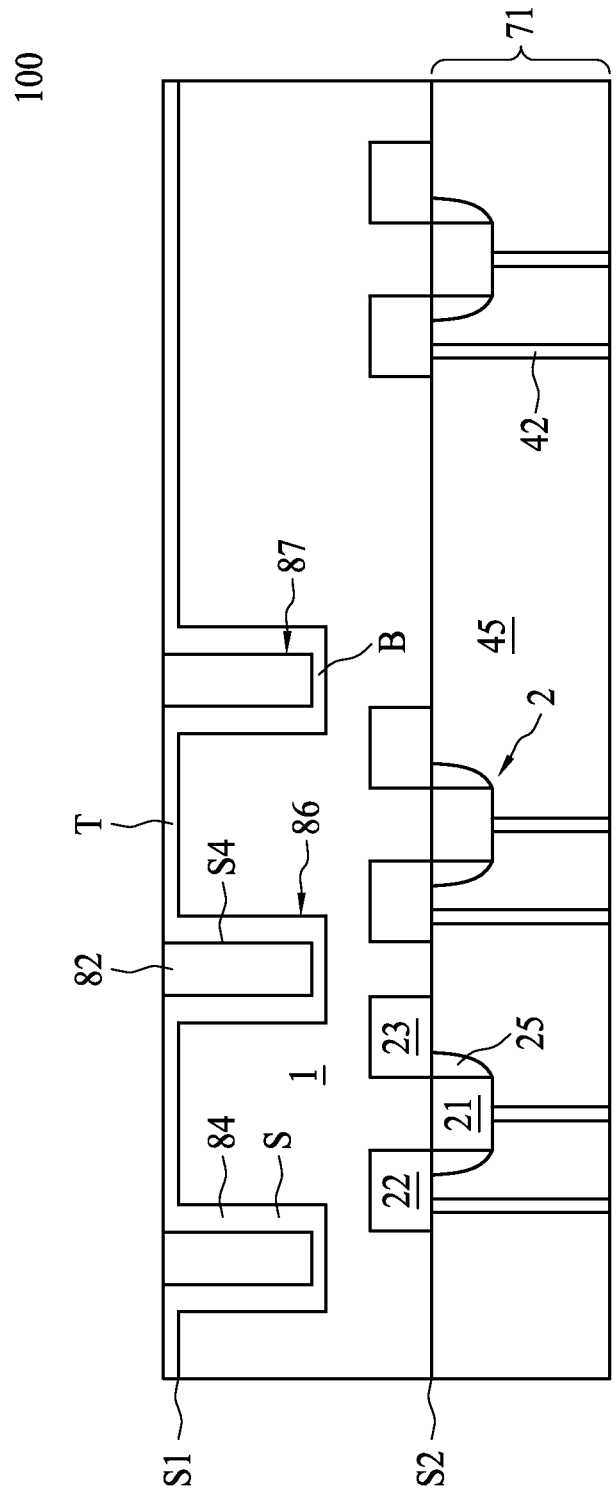
Figure 31:
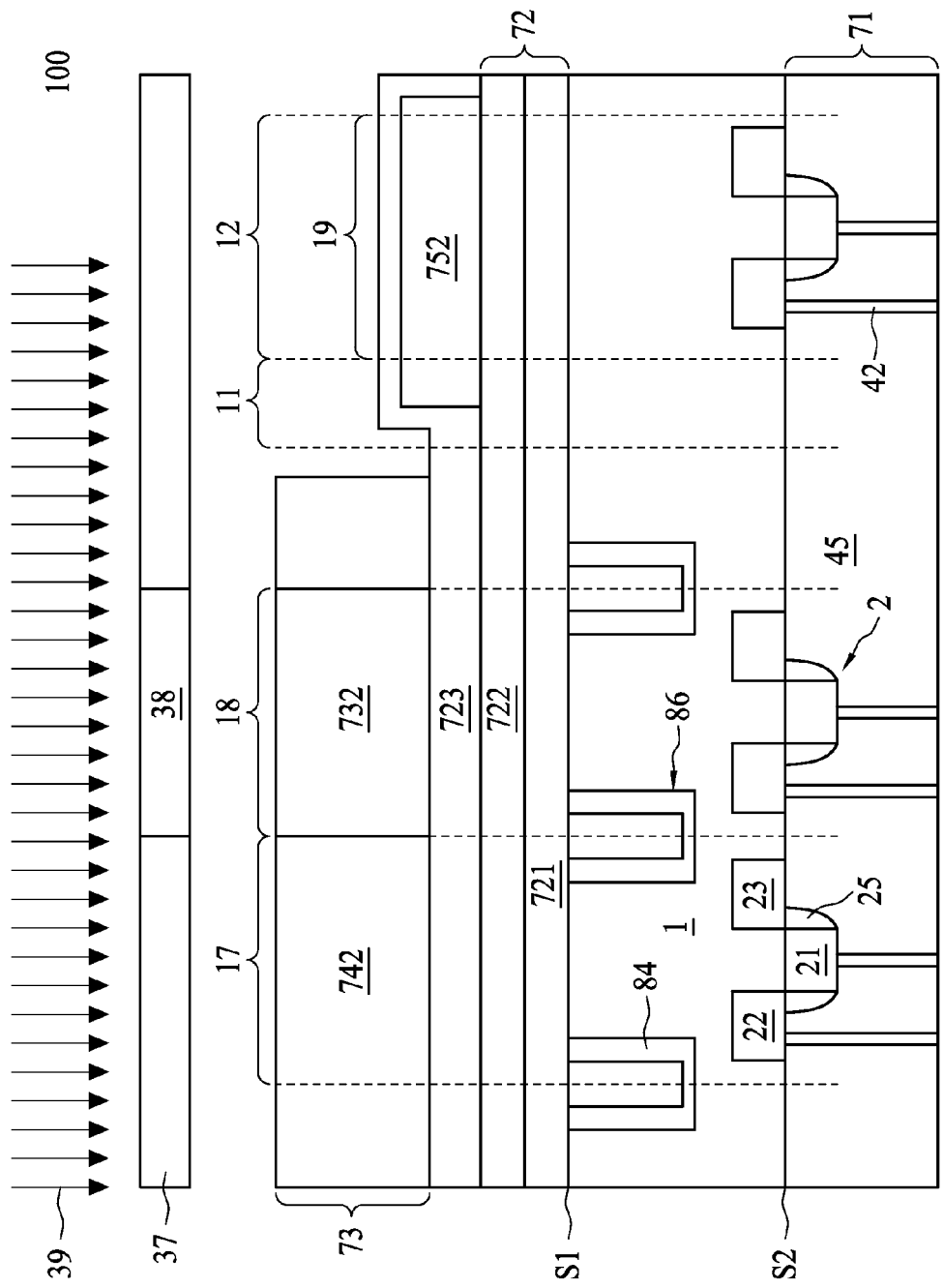
Figure 32:
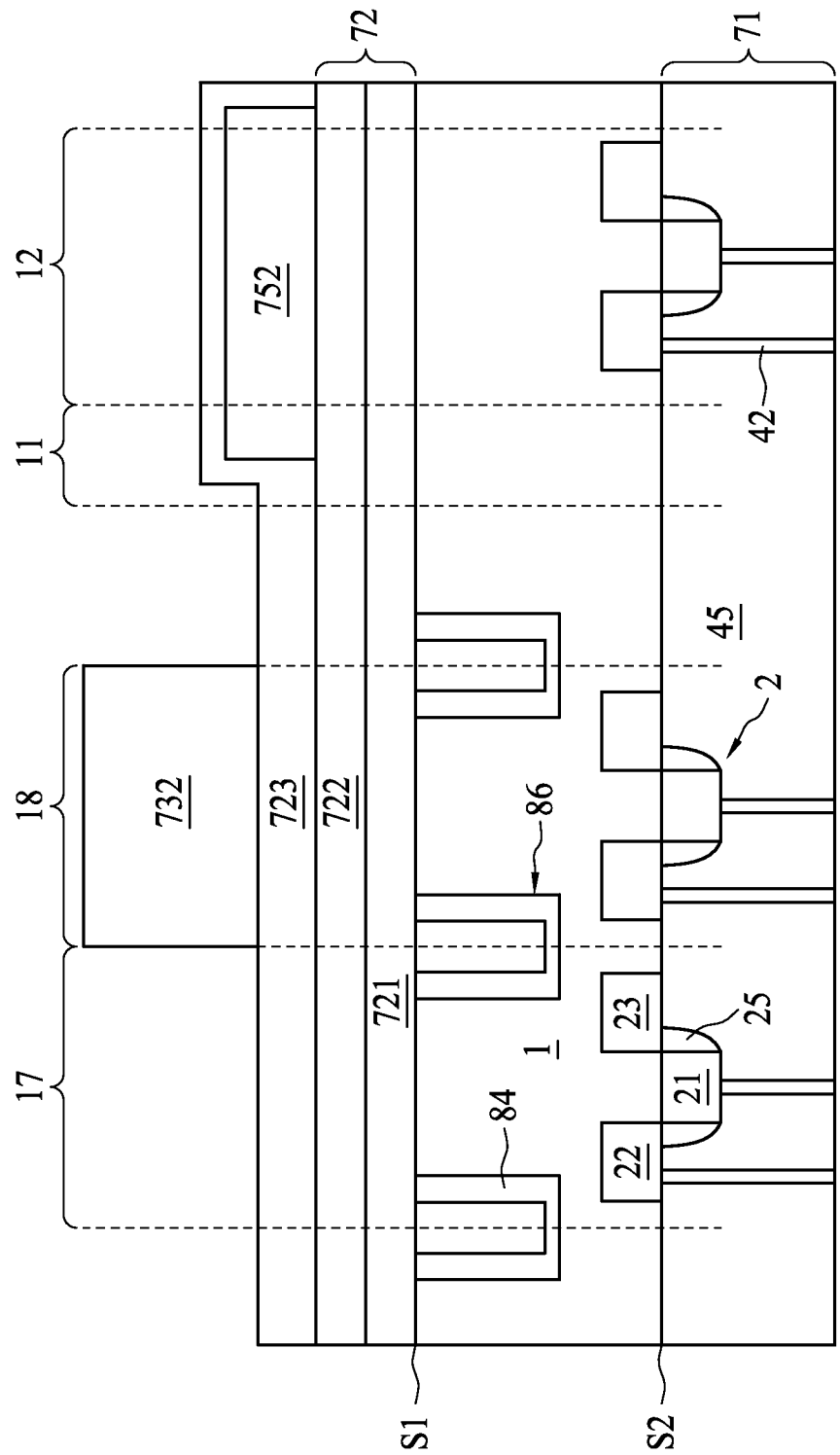
Figure 33:
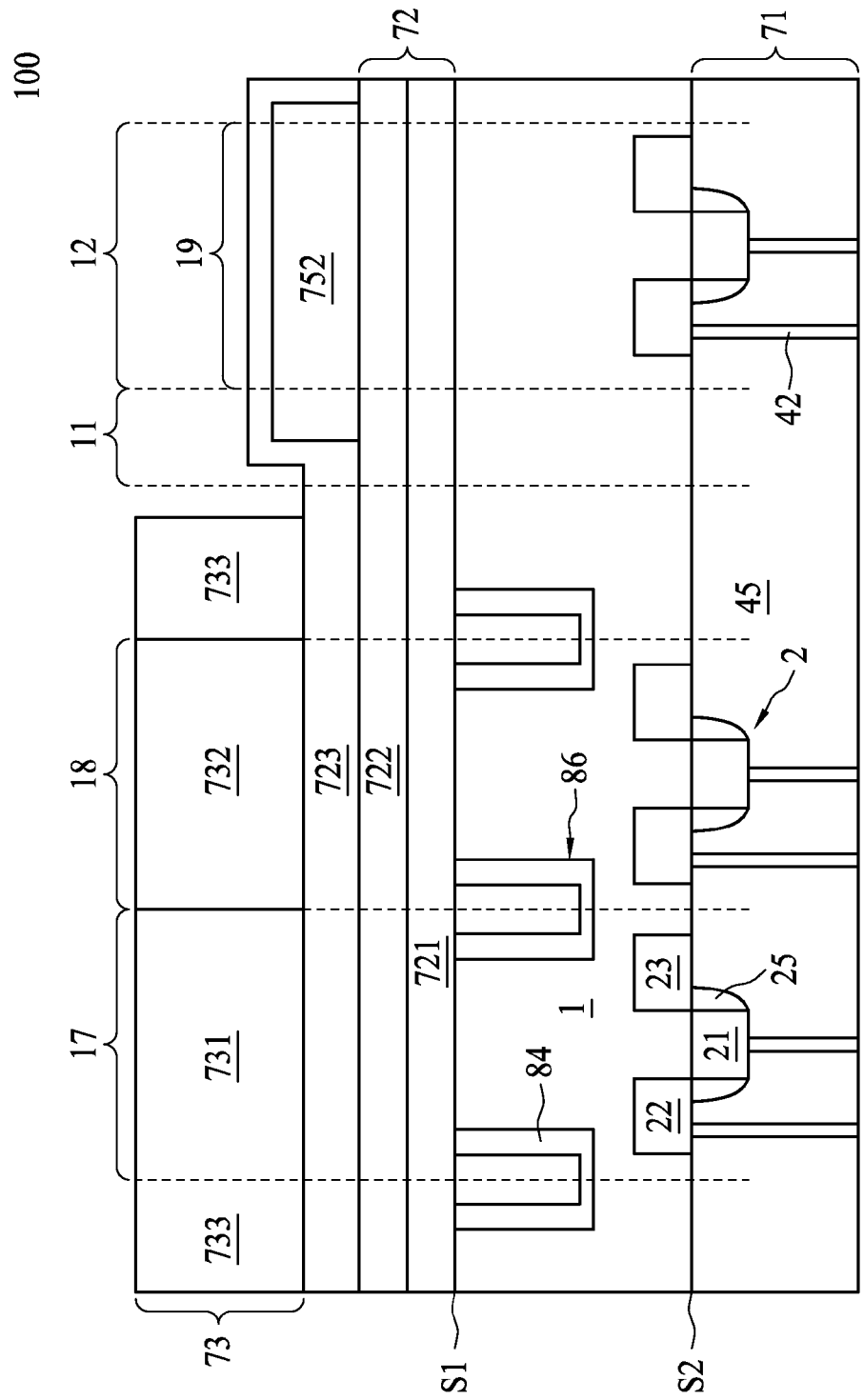

In FIG. 4, a method of manufacturing 400 is illustrated. FIG. 4 illustrates a process flow for forming the image sensor 100 in FIG. 2. Operation 410 receives a semiconductive substrate 1. Some exemplary embodiments for operation 410 are illustrated in FIG. 6. Operation 420 forms a transistor 2 coupled to a photosensitive element 22 or 23 at a front side S2 of the semiconductive substrate 1. Some exemplary embodiments for operation 420 are illustrated in FIGS. 7 to 9. Operation 430 forms a deep trench isolation (DTI) 86 at a back side S1 of the semiconductive substrate 1. Some exemplary embodiments for operation 430 are illustrated in FIGS. 16 to 17. Operation 440 forms a doped layer 81 conformally over the DTI 86. Some exemplary embodiments for operation 440 are illustrated in FIGS. 18 and 19. Operation 450 performs a microwave anneal 33 over the back side S1. Some exemplary embodiments for operation 450 are illustrated in FIGS. 20 to 22. Operation 460 forms a non-transparent material 82 inside the DTI 86. Some exemplary embodiments for operation 460 are illustrated in FIG. 24. Operation 470 forms a color filter 732 over the doped layer 84. Some exemplary embodiments for operation 470 are illustrated in FIGS. 31 to 33.

Figure 5:
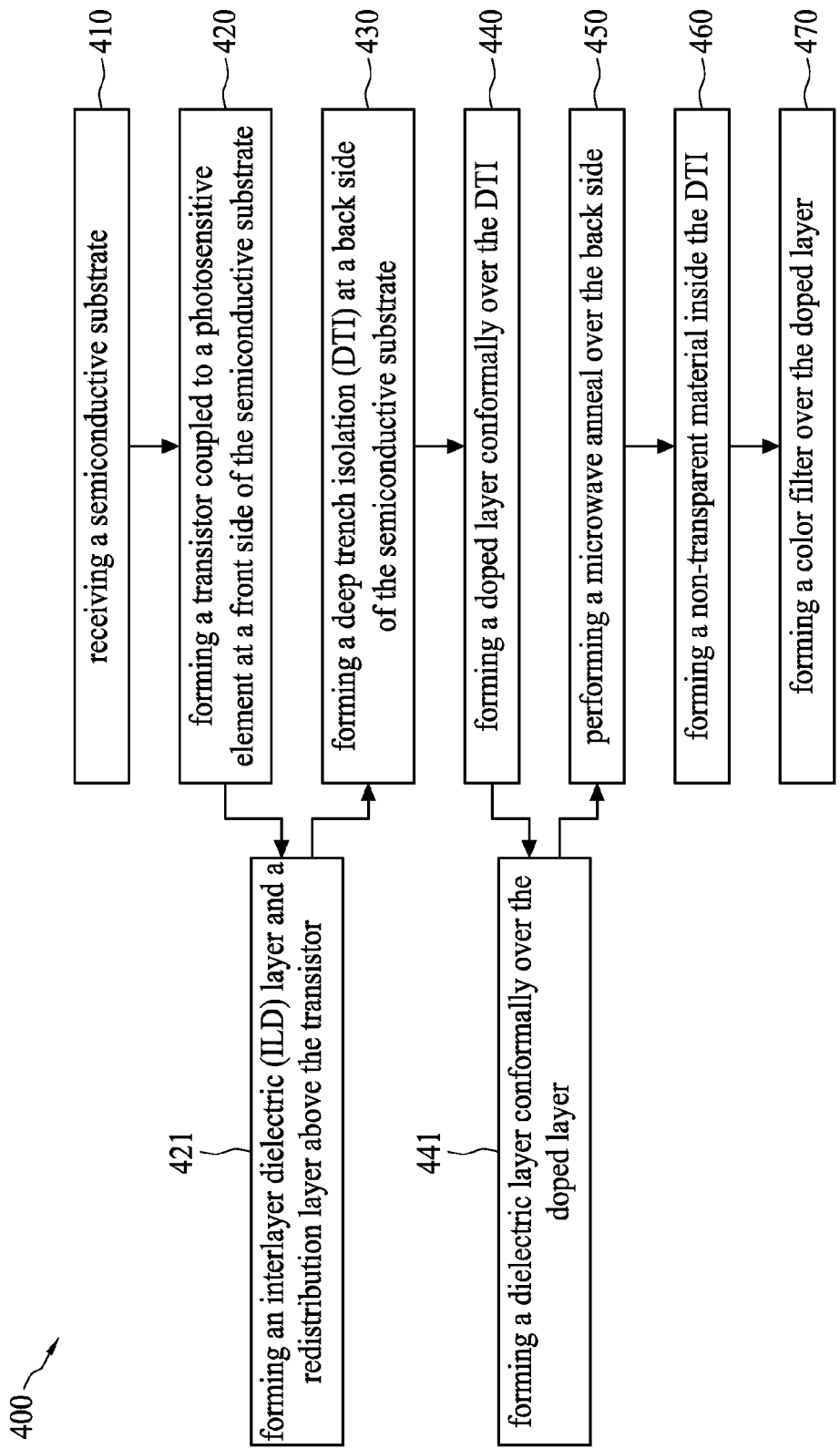
FIG. 5 is an operational flow of a method for manufacturing an image sensor, in accordance with some embodiments.
Figure 26:
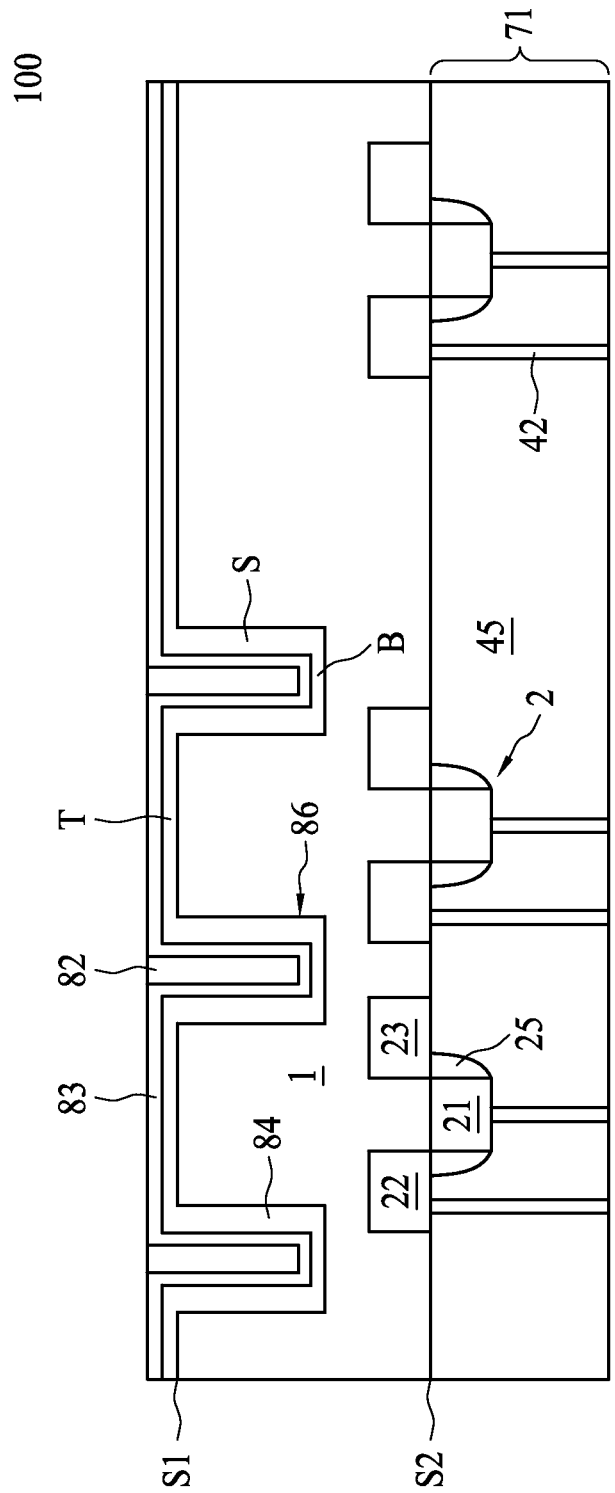

In FIG. 5, in some embodiments, a method of manufacturing 400 is illustrated. FIG. 5 includes some additional processes such as operation 421 and operation 441 inserted into the process flow for forming the image sensor 100. In FIG. 5, operation 421 is performed after forming a transistor 2 coupled to a photosensitive element 22 or 23 at a front side S2 of the semiconductive substrate 1 in operation 420. Operation 421 forms an interlayer dielectric (ILD) layer 71 and a redistribution layer 7 above the transistor 2. Operation 421 is followed by operation 430. Some exemplary embodiments for operation 421 are illustrated in FIGS. 10 to 15. Operation 441 is followed by forming a doped layer 81 conformally over the DTI 86 in operation 440. Operation 441 forms a dielectric layer 83 conformally over the doped layer 81. Some exemplary embodiments for operation 441 are illustrated in FIG. 26.

In FIG. 6, the semiconductive substrate 1 is received. In some embodiments, semiconductive substrate 1 includes an isolation region (not shown) formed by etching a trench in the semiconductive substrate 1 on the front side S2 and filling the trench with insulator materials such as silicon oxide, silicon nitride, or silicon oxynitride.

A gate dielectric layer 213 is covering over the semiconductive substrate 1. In an embodiment, gate dielectric layer 213 is a thin film formed by a suitable deposition process. A gate electrode layer 214 is covering on top of gate dielectric layer 213. In an embodiment, gate dielectric layer 213 and gate electrode layer 214 are sequentially deposited over semiconductive substrate 1 by some deposition processes. In some embodiments, gate electrode layer 214 is made of polysilicon.

The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure chemical vapor deposition (LPCVD) process, thermal oxidation, UV-ozone oxidation, epitaxial growth methods (e.g., selective epitaxy growth), sputtering, plating, spin-on coating, other suitable methods, and/or combinations thereof. The gate electrode layer 214 is deposited above the front side S2 of the semiconductive substrate 1.

The gate dielectric layer 213 and the gate electrode layer 214 are patterned by a lithographic process. In some embodiments, the gate dielectric layer 213 is patterned after the gate electrode layer 214 is patterned. In some embodiments, the lithographic process is a photolithographic process.

In the photolithographic process, a layer of resist 35 is formed on top of gate electrode layer 214 by a suitable process, such as spin-on coating, and patterned to form a resist feature by a photolithography patterning method. In some embodiments, the resist 35 is a photoresist. The resist feature can then be transferred by an etching process 32 to some underlying layers (i.e., gate electrode layer 214 or gate dielectric layer 213).

As an alternative to the photolithography, in some embodiments, a double-patterning lithography (DPL) process is used. The DPL process is a method of constructing a pattern on the gate electrode layer 214 by dividing the pattern into two interleaved patterns. Various DPL methodologies include double exposure (e. g., using two mask sets), forming some spacer features and removing the spacer features to provide a pattern, photoresist freezing, and/or other suitable processes. In some other embodiments, the photolithography process is implemented or replaced by other methods such as maskless photolithography, electron-beam writing, ion-beam writing, and/or molecular imprint. In another alternative, the lithography process could implement nanoimprint technology.

The etching process 32 is any suitable etching process such as dry etching, wet etching, reactive ion etching (RIE), and/or other etching methods. The etching process 32 is either purely chemical (plasma etching), purely physical (ion milling), and/or combinations thereof.

In FIG. 7, the resist feature is transferred to gate dielectric layer 213 and gate electrode layer 214 to form gate structure 21 on a front side S2 of the semiconductive substrate 1. The resist 35 is stripped thereafter. Gate structure 21 includes gate dielectric layer 213 and gate electrode layer 214.

In FIG. 8, an operation of forming a gate spacer 25 is illustrated. Gate spacer 25 is formed using any suitable process, including some processes described herein. A layer (not shown) is covering comformally over gate structure 21 and semiconductive substrate 1 by a deposition process. In some embodiments, the layer is made of dielectric materials such as silicon nitride, silicon nitride doped with carbon, silicon carbide, silicon oxide, silicon oxynitride, nitride with lower K, silicon oxynitride doped with carbon, other suitable materials, and/or combinations thereof. The layer is etched by any suitable etching process to form gate spacers 25 on either side of gate structure 21. In some embodiments, an anisotropic etching process by a dry etching process is used without photolithography. Some portions of the layer deposited on top of gate structure 21 and on front side S2 of semiconductive substrate 1 are etched faster than some vertical portions of the layer proximate to either side of gate structure 21. A thickness of gate spacer 25 is controlled by adjusting some process parameters in the deposition process. The process parameters in CVD includes a radio frequency (RF) source power, a bias power, a pressure, a flow rate, a wafer temperature, other suitable process parameters, and/or combinations thereof.

In FIG. 9, transistor 2 is formed coupling to photosensitive element 22 or 23 at front side S2 of the semiconductive substrate 1. In some embodiments, photosensitive element 22 or 23 is a source or a drain region formed by ion implantation or epitaxially growth. Ion implantation or epitaxial growth forms ion dopant in the source or the drain region. In various embodiments, the photosensitive element 23 or the photosensitive element 22 has different doping profiles formed by a multi-process implantation.

In some embodiments, a mask (not shown) is covered over gate structure 21 and over some portions of front side S2 of semiconductive substrate 1. A region uncovered by the mask is under ion implantation to form a first type of dopant. In some embodiments, the region uncovered by the mask is the source region containing p-type dopant as the first type of dopant. The mask is removed and a second mask is covered over gate structure 21 and over some other portions of front side S2 of semiconductive substrate 1. Subsequently, a second ion implantation is performed over front side S2. The second type of dopant is opposite to the first type of dopant. A region uncovered by the second mask is under the second ion implantation. In some embodiments, the region uncovered by the second mask is the drain region containing n-type dopant as the second type of dopant. The second mask is stripped thereafter.

Figure 10:
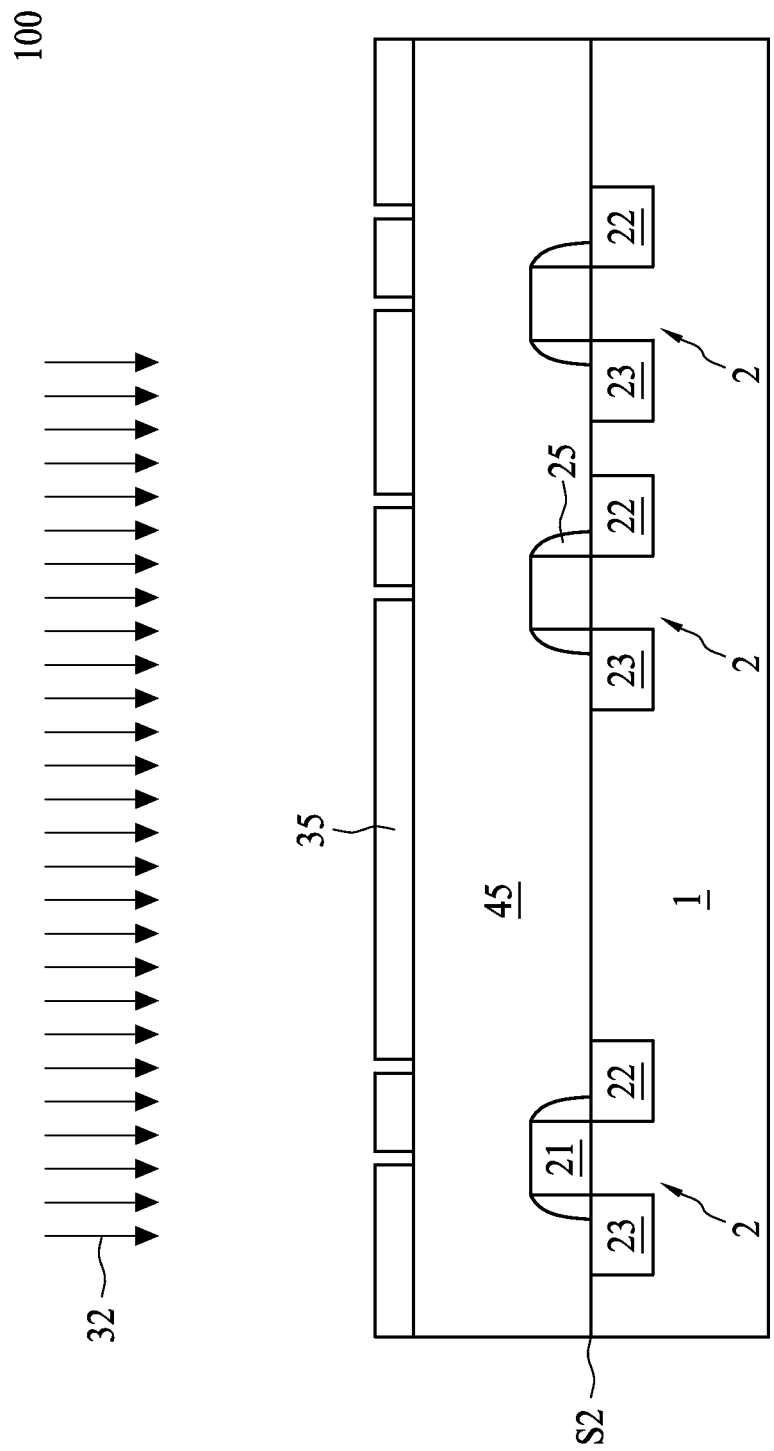

In FIG. 10, the dielectric layer 45 is covering over the semiconductive substrate 1 by any suitable process such as the deposition process. The dielectric layer 45 is in contact with front side S2 and gate structure 21. A resist 35 is formed on top of the dielectric layer 45. Some etching process 32 is performed to transfer a patterned resist feature to the dielectric layer 45.

Figure 11:
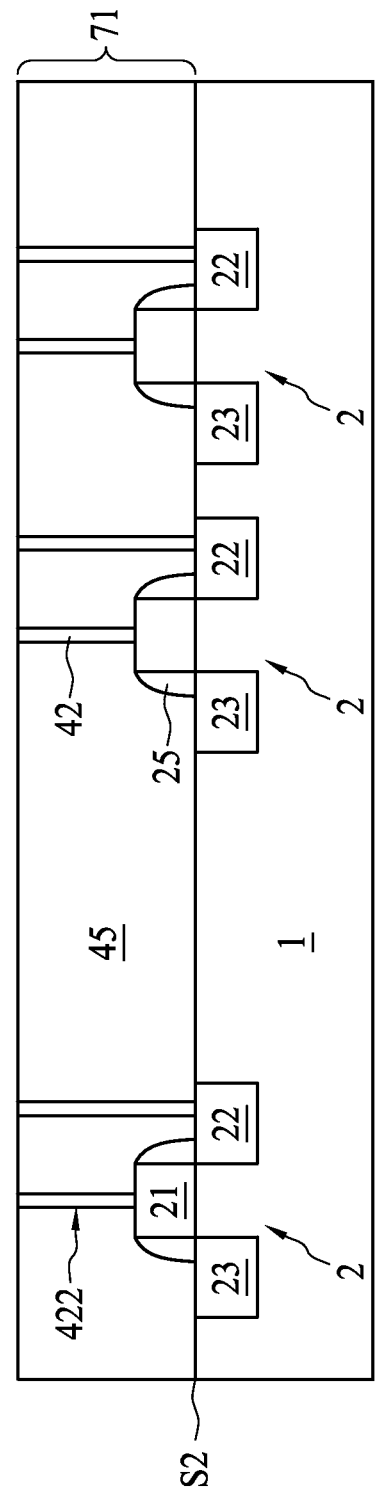

In FIG. 11, the patterned resist feature is transferred to dielectric layer 45 to form some trenches 422. In some embodiments, the trenches 422 are formed by any suitable etching process such as the selective etching, the dry etching, and/or combination thereof. The trenches 422 are filled by some conductive materials to form contacts 42. Contacts 42 are formed by filling the trenches 422 by some suitable processes such as the deposition process. A filling is up to a top of ILD layer 71. Contacts 42 are electrically couple with gate structure 21, photosensitive element 22, or photosensitive element 23 of transistor 2. A depth of the contacts 42 is controlled by adjusting some process parameters in a CVD process. The process parameters include a total pressure, some reactant concentrations, a deposition temperature, or a deposition rate.

Figure 12:
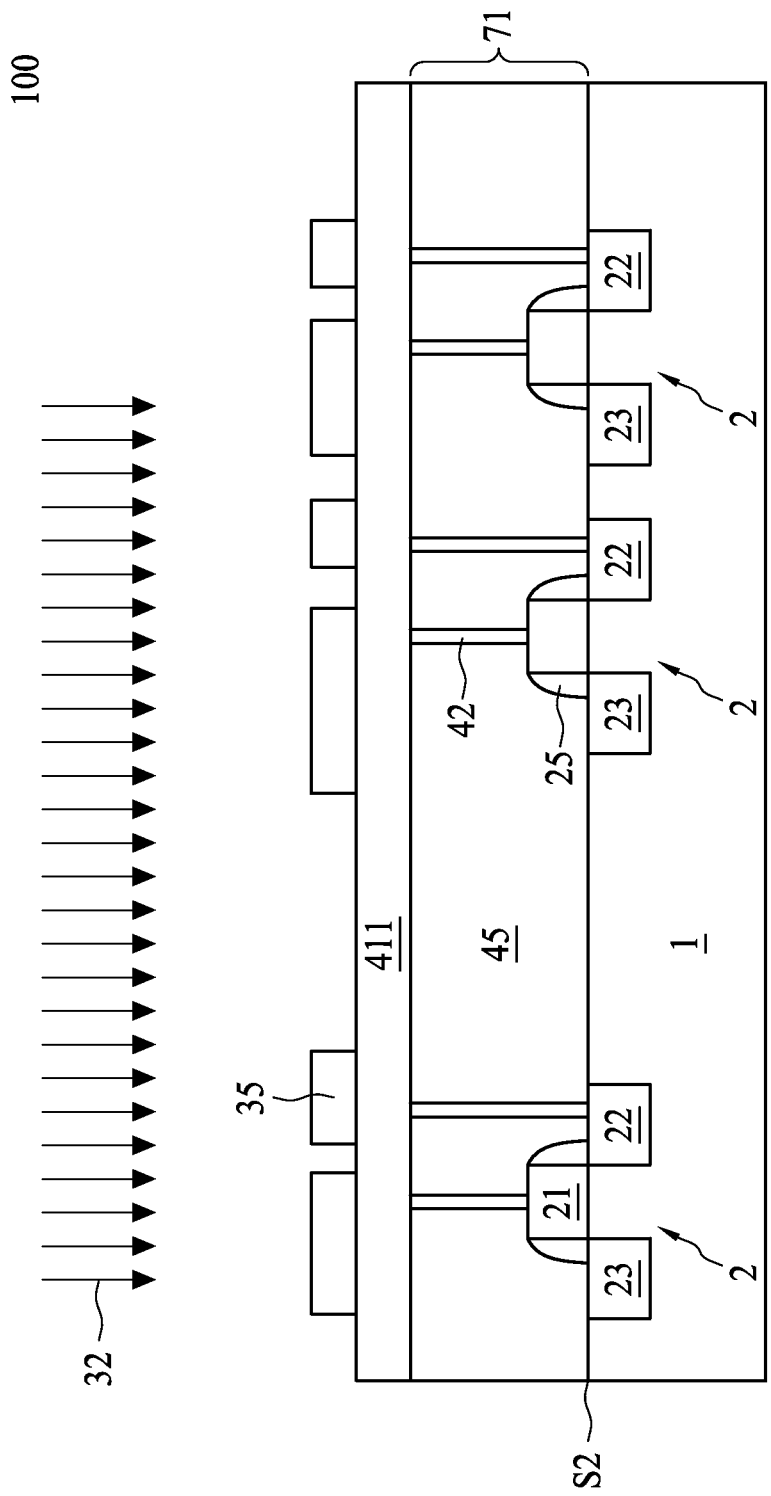
Figure 13:
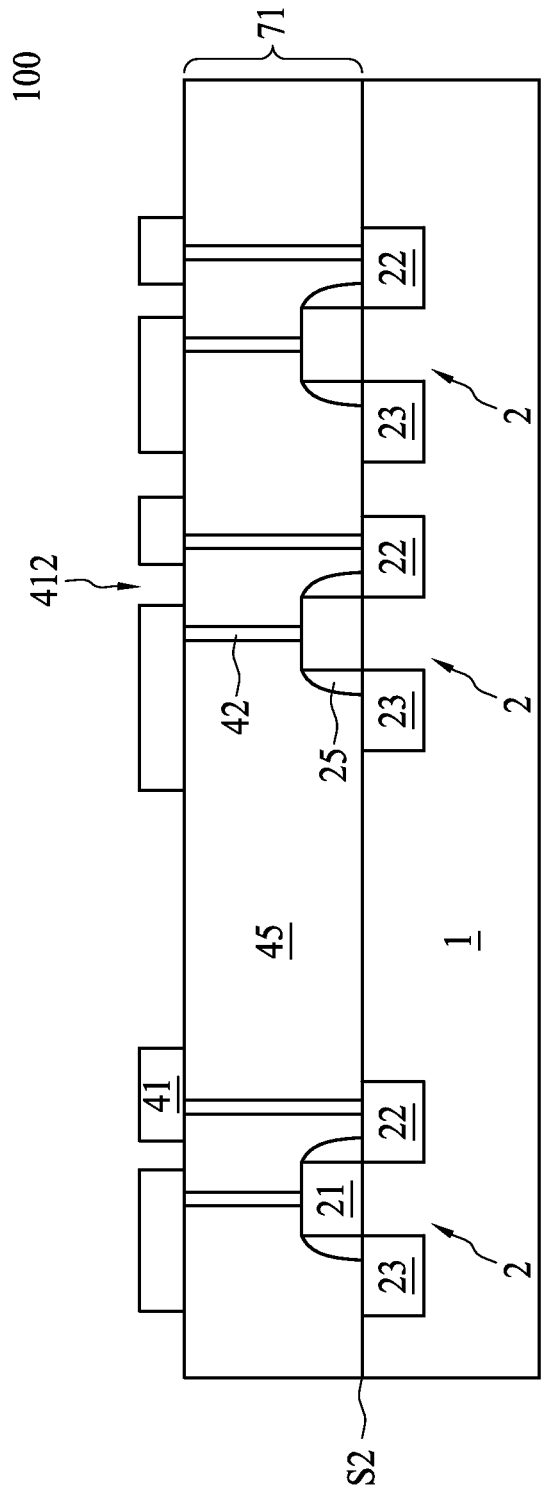

In FIG. 12, a conductive layer 411 are deposited and patterned by transferring a resist feature of resist 35 to conductive layer 411. The resist feature is transferred to conductive layer 411 to form recesses 412 and interconnections 41 in FIG. 13. The recesses 412 are to be filled by some dielectric materials to form the dielectric layer 46 over the ILD layer 71 in FIG. 14. The dielectric materials are covering over the interconnections 41.

Figure 14:
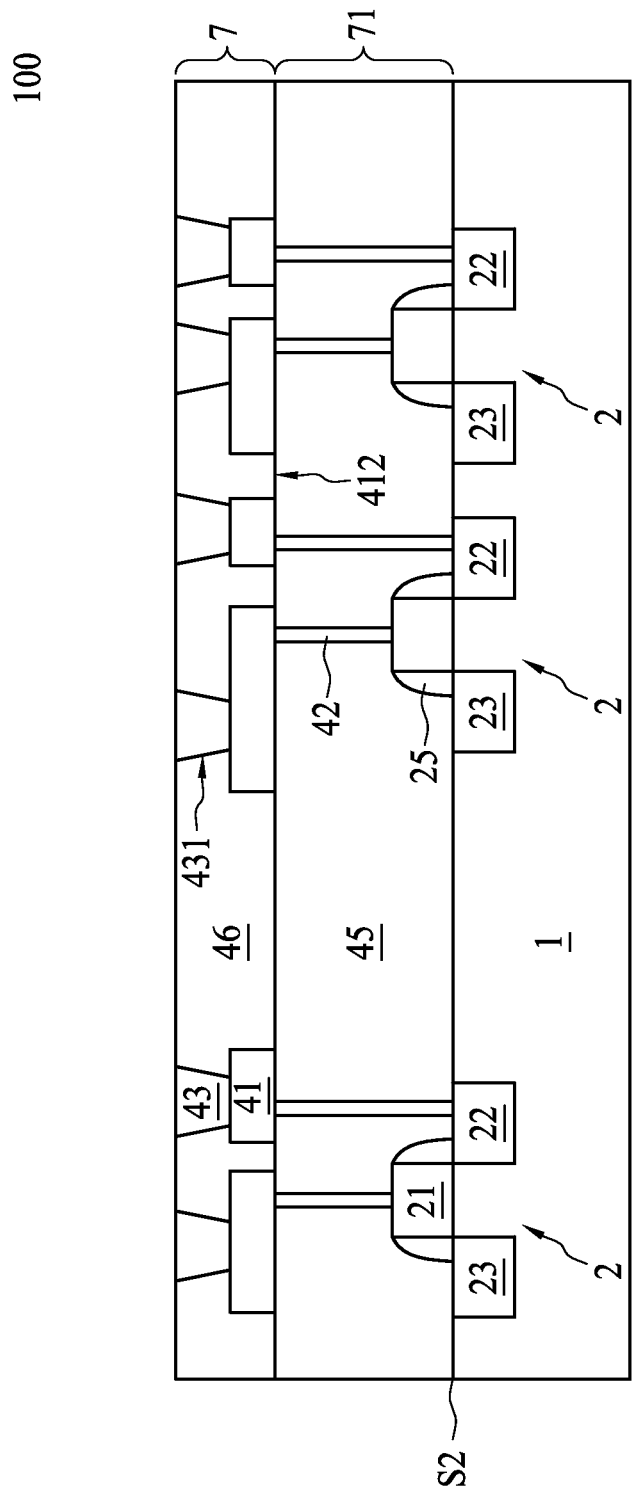

In FIG. 14, recess 431 is formed on dielectric layer 46 by some suitable etching processes. The suitable etching process exposes some portions of the interconnection 41. A conductive material is filled inside the recess 431 to form via 43. In some embodiments, a planarization, such as chemical mechanical planarizing CMP, is used to remove some excess blanket layers of the conductive materials such that the vias 43 are coplanar with a top of the dielectric layer 46.

Figure 15:
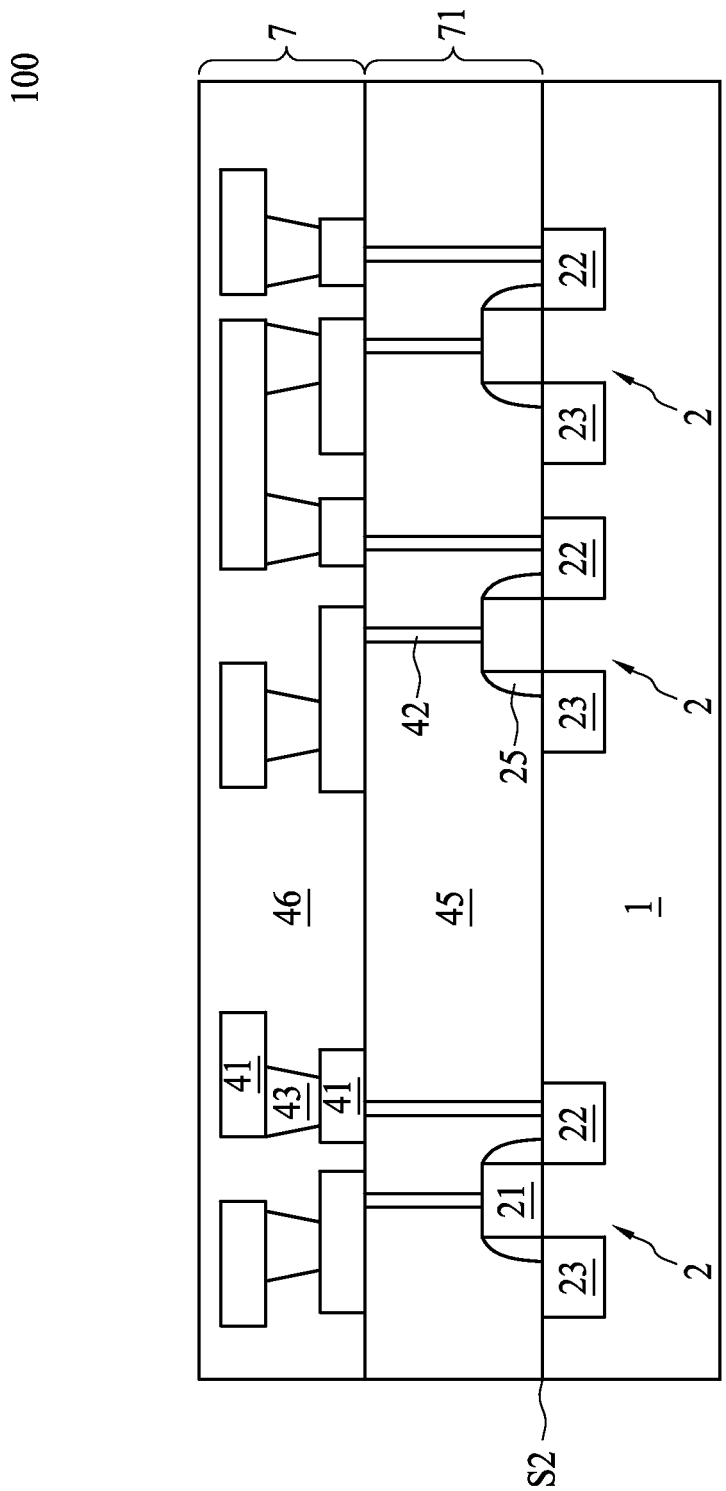

In FIG. 15, additional layer of interconnection 41 is formed in a similar fashion as a first layer of interconnection 41. In some embodiments, dielectric layer 46 is covering over the vias 43 and patterned to form some recesses to be filled by a conductive material to form interconnection 41. A dielectric material is deposited over interconnection 41.

In FIG. 16, the image sensor 100 is flipped upside down such that the back side S1 of the semiconductive substrate 1 is above the front side S2. The back side S1 is partially covered by resists 35 with some openings 351. Openings 351 expose some portions of back side S1 of semiconductive substrate 1 to etching process 32 in the photolithographic process. Openings 351 are spaced from each other by predetermined distance D5. Resist 35 includes a resist feature with width W inside each pixel region 17 or 18.

In FIG. 17, in some embodiments, the etching process 32 is a dry etching process over the back side S1 of the semiconductive substrate 1. The dry etching process is implemented in an etching chamber. Some process parameters in the dry etching process includes a radio frequency (RF) source power, a bias power, electrode size, a pressure, a flow rate, etching duration, a wafer temperature, other suitable process parameters, and/or combinations thereof. The dry etching process implements any suitable gas such as an oxygen-containing gas, fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr, He and/or CHBR3), iodine-containing gas, other suitable gases (Ar and/or CH4) and/or plasmas, and/or combinations thereof. In some embodiments, the dry etching process utilizes an O2 plasma treatment and/or an O2/N2 plasma treatment. Further, the dry etching process can be performed for a suitable duration under certain pressure range. Some process parameters such as etching durations and/or etch rate are adjustable to control depth D4 of DTI 86. DTI 86 is formed at a back side S1 of the semiconductive substrate 1.

Resist 35 is stripped after the dry etching process. After DTI 86 is formed, resist 35 is removed by using the wet etching process. The wet etching process is utilizing a hydrofluoric acid (HF) solution for a HF dipping process. Liquid chemical such as acids, bases, or solvents are used to chemically remove the resist 35. In some embodiments, the wet etching process is applying a diluted hydrofluoric acid to an intermediate structure. In some embodiments, the wet etching process includes exposing to a hydroxide solution containing ammonium hydroxide, diluted HF, deionized water, and/or other suitable etchant solutions.

In FIG. 18, doped layer 81 is formed conformally over the DTI 86. Doped layer 81 is lined inside the DTI 86 following a contour of DTI 86 and over the semiconductive substrate 1. Doped layer 81 is formed by using a p-type dopant or an n-type dopant. In some embodiments, doped layer 81 is formed by ion implantation 31. A dopant in p-type or n-type is implanted into semiconductive substrate 1. The dopant is buried into semiconductive substrate 1 such that a bottom portion B1 of doped layer 81 is over front side S2 by distance D21. Bottom portion B1 is spaced apart from photosensitive element 22 or 23 by a distance D31. A top portion T1 of doped layer 81 is away from front side S2 by a distance D71. In various embodiments, doped layer 81 is formed by a multi-process implantation or different implantation process to form different doping profiles within doped layer 81.

In FIG. 19, in some other embodiments, doped layer 81 is formed conformally over the DTI 86 by epitaxially growing the doped layer 81 in the DTI 86 and over the back side S1. Doped layer 81 includes a bottom portion B1, a side portion SP1, and a top portion T1. Bottom portion B1 and side portion SP1 forms a recess 87. The dopant is formed in doped layer 81 such that bottom portion B1 of doped layer 81 includes a thickness TH31. Bottom portion B1 is over front side S2 by distance D22. In some embodiments, distance D22 is greater than distance D21 in FIG. 18. In some embodiments, distance D22 is substantially the same as distance D21.

In some embodiments, doped layer 81 includes a variable doping concentration profile by some multi-process implantations, epitaxial growths, or combination thereof. For example, bottom portion B1 includes a higher doping concentration than side portion SP1 of doped layer 81. Side portion SP1 includes a higher doping concentration than top portion T1 of doped layer 81. In some embodiments, bottom portion B1, side portion SP1, or top portion T1 includes different doping type or doping concentration. For example, a dopant for top portion T1 includes p-type dopant, while dopant for bottom portion B1 includes n-type dopant. The doping concentration of bottom portion B1, side portion SP1, or top portion T1 is uniform or gradient. A graded concentration of a doping profile is changing abruptly or gradually from top portion T1 to bottom portion B1, or from top portion T1 to side portion SP1. In some embodiments, doped layer 81 includes a plurality of doped portions.

In FIG. 20, a microwave annealing process 33 is performed over back side S1 and over doped layer 81. The dopants in doped layer 81 are activated using low temperature activation such as microwave annealing process 33. To activate doped layer 81 including a certain thickness such as thickness TH31, microwave annealing process 33 with an appropriate wavelength is advantageously employed. For example, in some embodiments, microwave annealing process 33 includes microwave with wavelength in a range of approximately from 1 to 2 centimeters, from 2 to 4 centimeters, from 4 to 6 centimeters, from 6 to 8 centimeters, or from 8 to 10 centimeters. Microwave annealing process 33 is performed for any suitable duration.

In some embodiments, a dry or wet cleaning is performed using ammonium biflouride or HP followed by a transfer to a microwave processing chamber under a vacuum. In some embodiments, microwave annealing process 33 is performed in an H2 background gas to further react with a residual oxide in DTI 86 and provide H atoms that couple with silicon in DTI 86. This process enables the silicon atoms in a lattice in doped layer 81 to grow at low temperatures. In some embodiments, a wet etching process is performed before or after microwave annealing process 33. In some embodiments, the background gases include forming gas, i.e. N2 or H2, or combinations thereof in various concentrations.

FIG. 21 is an exemplary embodiment for FIG. 3. FIG. 21 illustrates another embodiment of the present disclosure. FIG. 21 is following the embodiment of FIG. 19. In FIG. 21, after the operation of forming doped layer 81 in FIG. 19, a dielectric layer 83 is formed over doped layer 81. Dielectric layer 83 is overlying on top of doped layer 81 following a contour of doped layer 81. Dielectric layer 83 is partially filling the recess 87. Dielectric layer 83 is lining against a side of recess 87 such that a recess 88 is formed over the recess 87.

Dielectric layer 83 is formed before the operation of microwave annealing process 33. In some embodiments, dielectric layer 83 is a polarized dielectric layer. The polarized dielectric layer is configured to increase heat in doped layer 81 by a polarized inversion effect. The dielectric layer 83 is configured to transfer heat to activate dopant in doped layer 81.

After microwave anneal 33, in some embodiments, a size of doped layer 81 is changed. For example, bottom portion B1 of doped layer 81 is expanded such that distance D22 between bottom portion B1 and front side S2 is decreased after microwave anneal 33.

FIG. 22 is an exemplary embodiment for FIG. 2. In FIG. 22, doped layer 81 is activated without dielectric layer 83 on top of doped layer 81. Doped layer 81 is continued from doped layer 81 in FIG. 19. A microwave anneal 33 is performed over the back side S1. Microwave anneal 33 alters a physical size of the doped layer 81 to another physical size of the doped layer 84. For example, vertical thickness TH 31 of doped layer 81 is expanded to vertical thickness TH3 of doped layer 84. In some embodiments, vertical thickness TH31 is changed to vertical thickness 3 by an activation process such as microwave annealing process 33. The physical size of doped layer 81 is changed for each portion of doped layer 81. For example, top portion T1 of doped layer 81 is expanded to top portion T of doped layer 84. Side portion SP1 of doped layer 81 is expanded to side portion S of doped layer 84. Bottom portion B1 of doped layer 81 is expanded to bottom portion B of doped layer 84. In some embodiments, each portion is changed by a similar proportion. In some other embodiments, each portion is changed by a different proportion.

Figure 23:
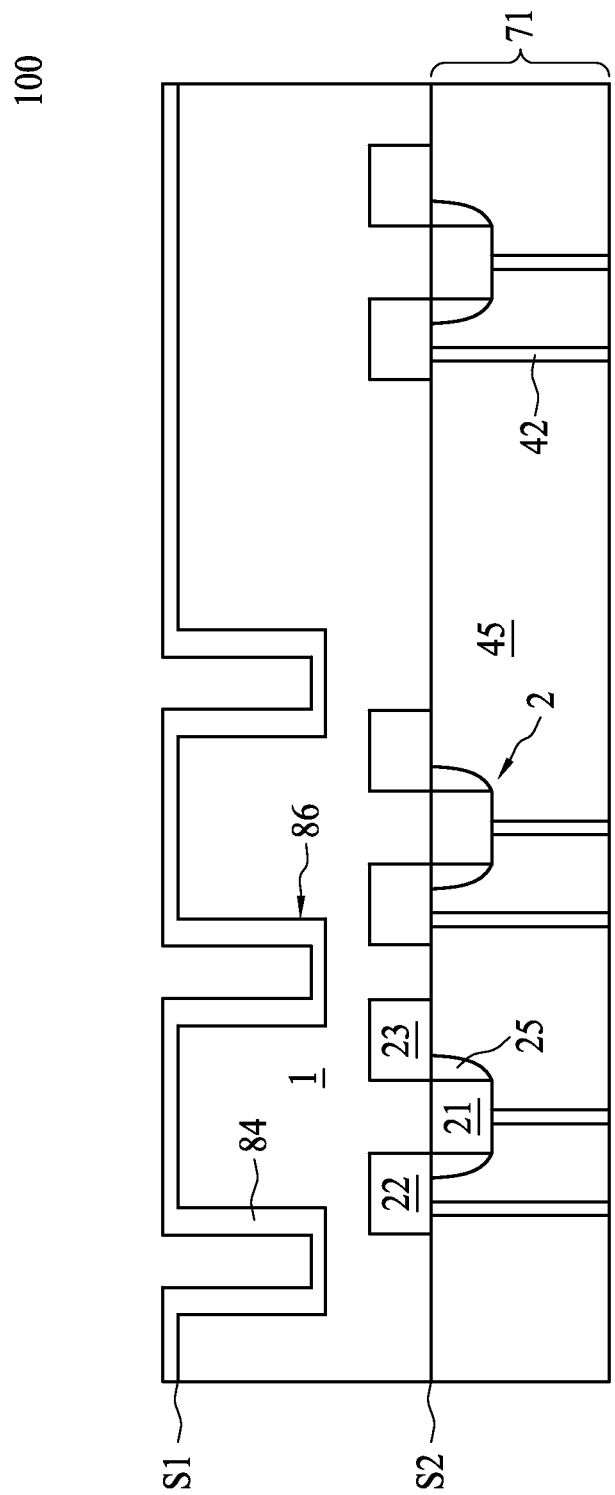

FIG. 23 illustrates another embodiment of the present disclosure. FIG. 23 is following the embodiment from FIG. 21. In FIG. 23, in some embodiments, dielectric layer 83 in FIG. 21 is stripped away after the activation by some suitable process such as microwave annealing process 33. Doped layer 84 is exposed. In some embodiments, a size of doped layer 84 is substantially larger than a size of doped layer 81 in FIG. 21. Dielectric layer 83 is removed by any suitable process such as the etching process. The etching process includes dry etching, wet etching, reactive ion etching (RIE), and/or other etching methods.

FIG. 24 illustrates another embodiment of the present disclosure. FIG. 24 is following the embodiment from FIG. 23. In FIG. 24, image sensor 100 does not include dielectric layer 83. In FIG. 24, in some embodiments, non-transparent material 82 is filled in DTI 86. Non-transparent material 82 is border with inner side S4 of doped layer 84. Non-transparent material 82 is filling inside recess 87. In some embodiments, non-transparent material 82 is covering over back side S1. A planarization is performed to remove excess non-transparent material 82 such that a top of non-transparent material 82 is coplanar with top portion T of doped layer 84. In some embodiments, a conductive material is filled inside DTI 86 by any suitable deposition process.

Figure 25:
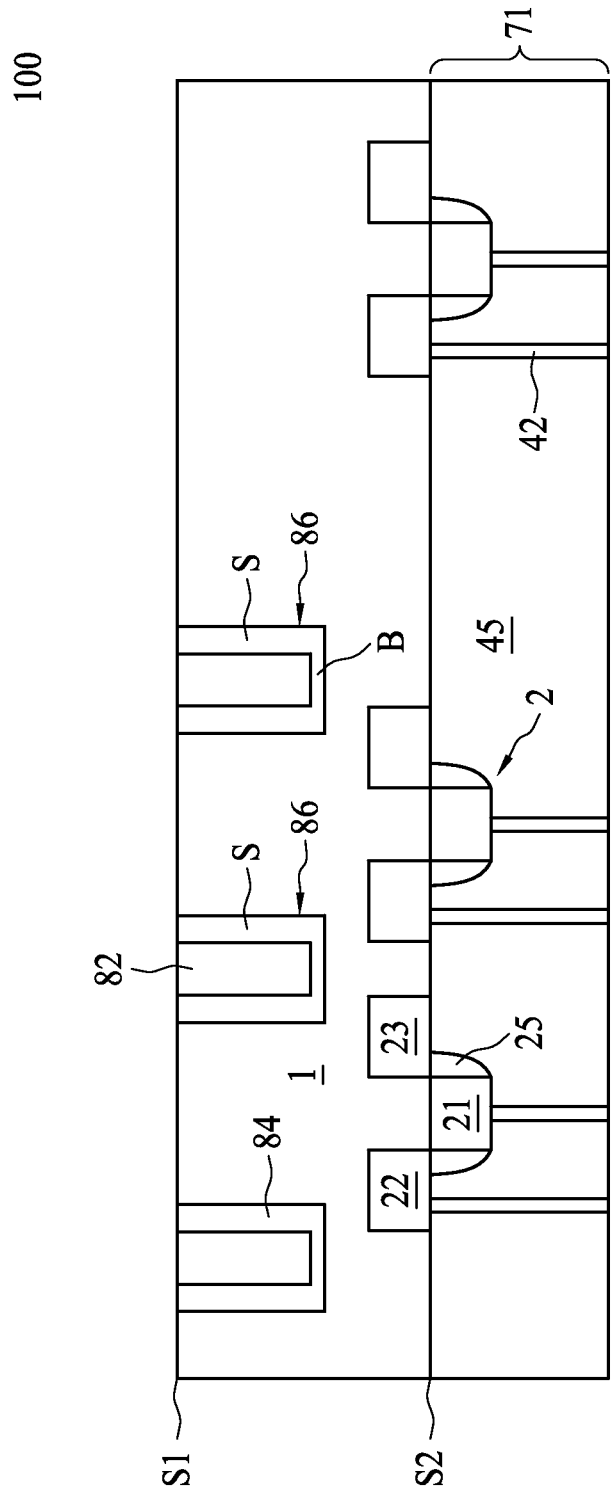

FIG. 25 is an exemplary embodiment for FIG. 2. In some embodiments, FIG. 25 is following the embodiment of FIG. 24. In FIG. 25, in some embodiments, a planarization is performed to remove top portion T of doped layer 84 after non-transparent material 82 is formed. The planarization exposes back side S1 of semiconductive substrate 1. Top portion T of doped layer 84 is removed and a side portion S of one DTI 86 is disconnected with another side portion S of another DTI 86. In some embodiments, the planarization includes using any suitable process such as CMP, etch back, or selective etching. In some embodiments, the selective etching includes a faster etching rate for doped layer 84 than for an underlying semiconductive substrate 1.

FIG. 26 illustrates another embodiment of the present disclosure. FIG. 26 is following the embodiment from FIG. 21. In FIG. 26, dielectric layer 83 is remained over doped layer 84. In FIG. 26, in some embodiments, dielectric layer 83 is remained and covering conformally over top portion T of doped layer 84. Non-transparent material 82 is filling in dielectric layer 83 such that non-transparent material 82 is lining against side portion S of doped layer 84. In some embodiments, non-transparent material 82 is filling up to a level of top portion T. In some embodiments, non-transparent material 82 is filling over top portion T. A planarization is performed to remove excess non-transparent material 82 such that a top of non-transparent material 82 is coplanar with dielectric layer 83.

Figure 27:
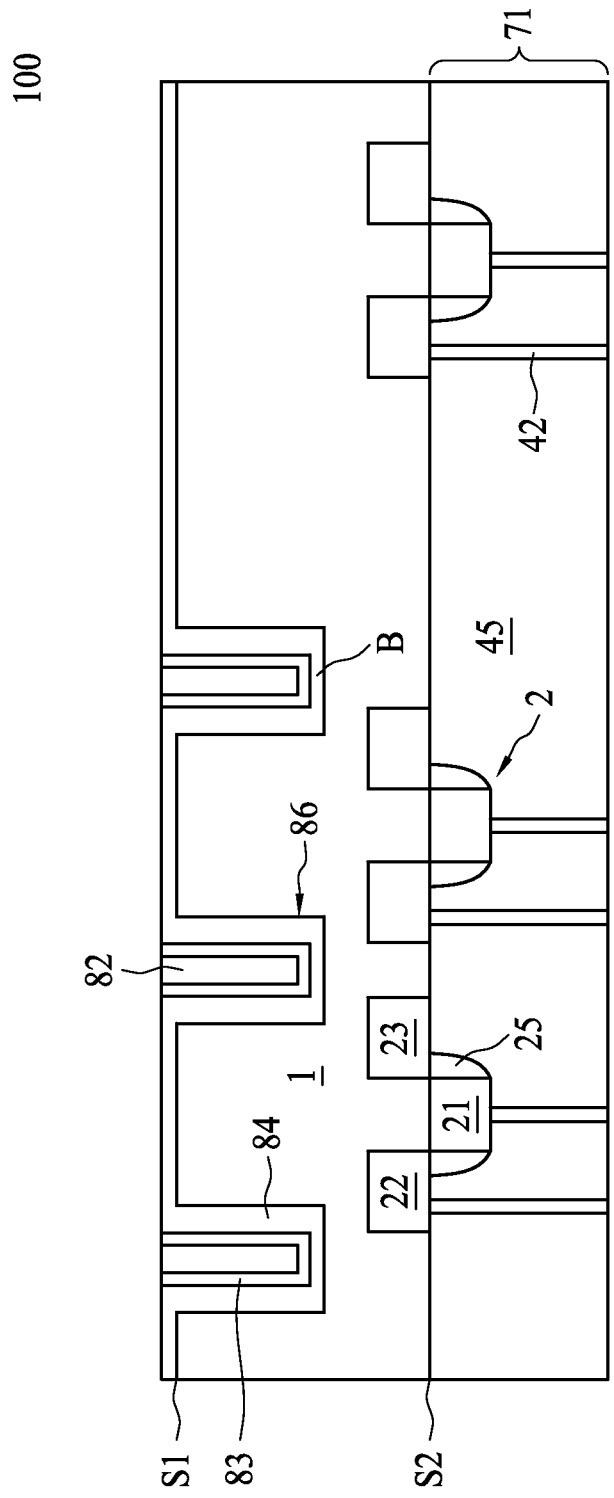

FIG. 27 is an exemplary embodiment for FIG. 3. In some embodiments, FIG. 27 is following the embodiment from FIG. 26. In FIG. 27, a remained dielectric layer 83 is planarized. In FIG. 27, in some embodiments, a planarization is performed to remove a top portion of dielectric layer 83 such that top portion T of doped layer 84 is exposed. A vertical side portion of dielectric layer 83 is remained between non-transparent material 82 and doped layer 84. The planarization includes any suitable processes such as CMP or etching back. In some embodiments, the top portion of dielectric layer 83 is removed by selective etching.

In some embodiments, the selective etching uses some fluorine-containing gas, HBr and/or C12 as etch gases. In some embodiments, a bias voltage used in the selective etching process is adjusted for controlling an etching direction to be isotropic or anisotropic for a removal of the top portion of dielectric layer 83 or excess portion of non-transparent material 82 proximate to back side S1. In some embodiments, the selective etching includes a faster etching rate for dielectric layer 83 than for an underlying doped layer 84. Different etchant can be used for etching different compositions of materials.

Figure 28:
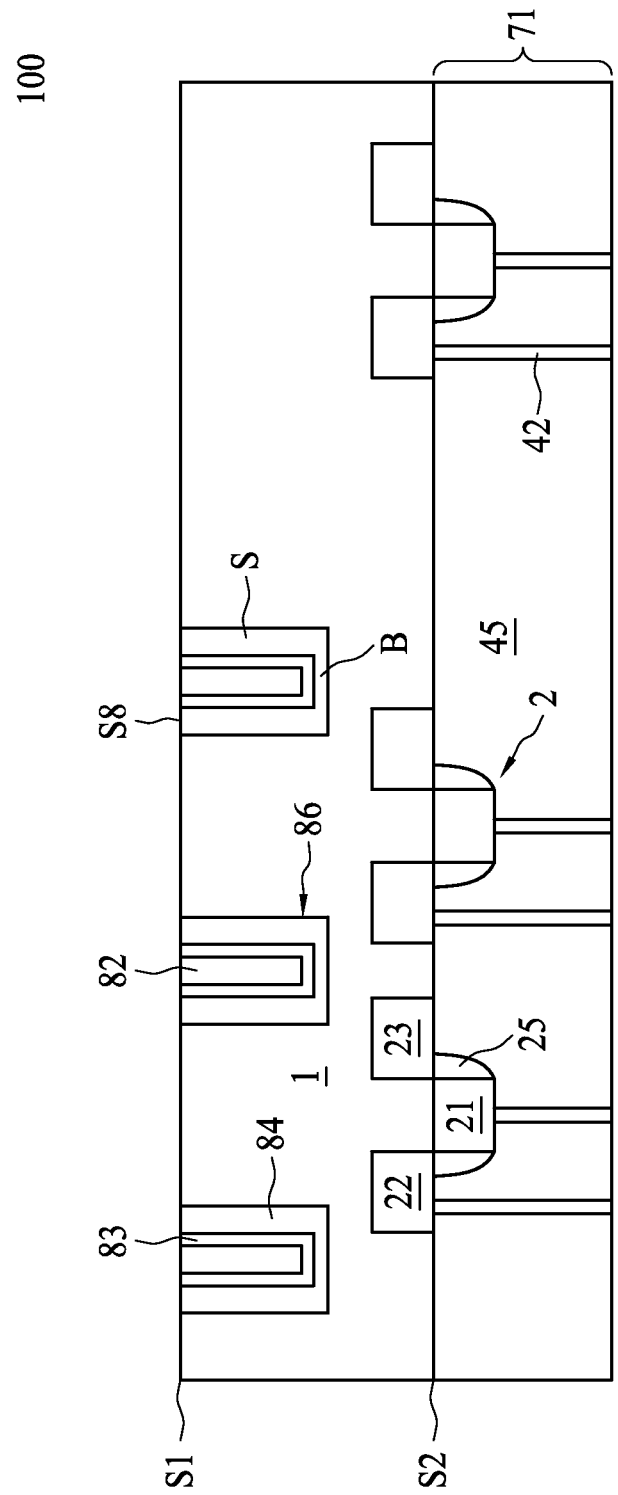

FIG. 28 illustrates another embodiment of the present disclosure. FIG. 28 is following the embodiment from FIG. 27. In FIG. 28, another planarization is performed to further remove excess doped layer 84. In FIG. 28, in some embodiments, both the top portion of dielectric layer 83 and top portion T of doped layer 84 are planarized. In some embodiments, the planarization is performed subsequently after the operation of forming doped layer 84, dielectric layer 83, and non-transparent material 82. Back side S1 is exposed. Excess top portions of doped layer 84, dielectric layer 83, and non-transparent material 82 are planarized such that back side S1 is coplanar with top surface S8 of side portion S of doped layer 84. A top surface S8 of side portion S is exposed. Back side S1 of semiconductive layer is made substantially flat by planarization including processes such as CMP, etch back, or selective etching.

Figure 29:
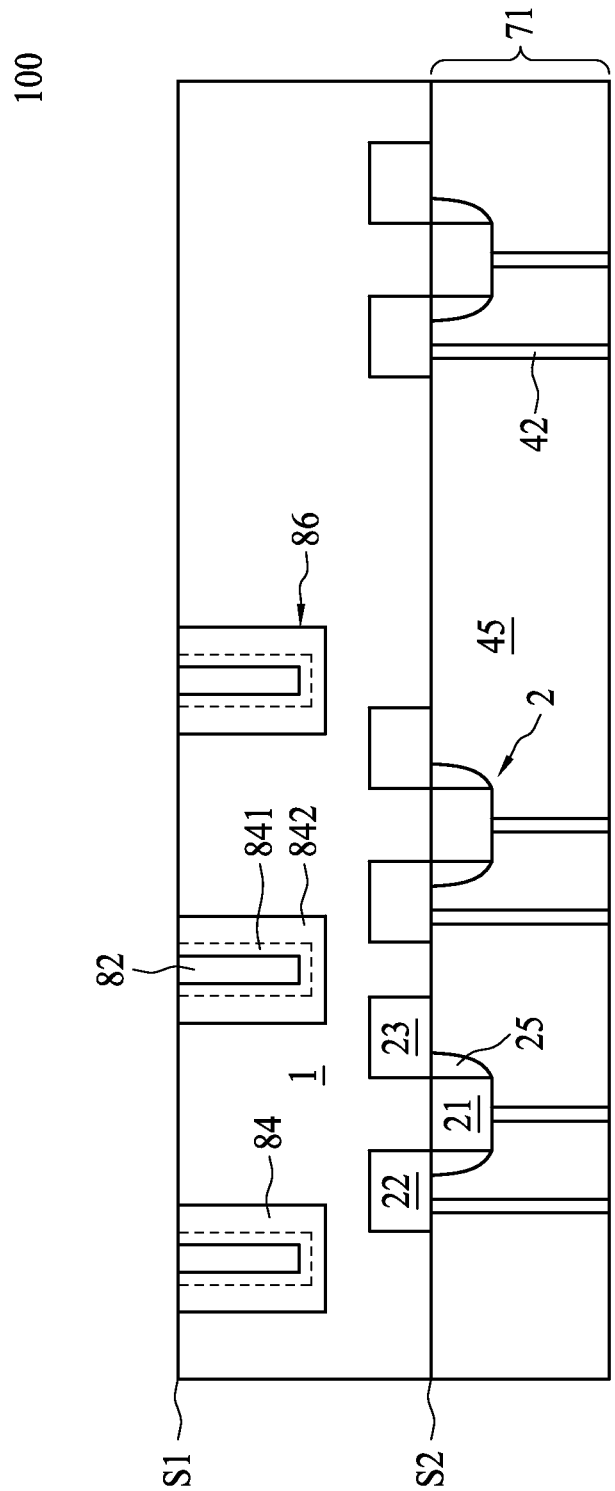

FIG. 29 illustrates another embodiment of the present disclosure. FIG. 29 is following the embodiment from FIG. 17. In FIG. 29, different doped region 841 and 842 are formed in DTI 86. No dielectric layer 83 is in between doped layer 84 and non-transparent material 82. In FIG. 29, in some embodiments, doped layer 84 is formed including a doping concentration profile. In some embodiments, doped region 842 is formed first closer to an outer surface of DTI 86 by any suitable method such as implantation or epitaxial growth. The outer surface is side S3 or bottom side S5 of DTI 86. Doped region 841 then formed over doped region 842 by any suitable method such as implantation or epitaxial growth. In some embodiments, a first activation process such as microwave annealing is subsequently performed after the operation of forming doped region 842. Subsequently, doped region 841 is formed over an activated doped region 842. A second activation process is subsequently performed after the operation of forming doped region 841. In some embodiments, a plurality of doped regions is formed. In some embodiments, the activation process such as microwave annealing is performed between each formation of the doped region. In some other embodiments, the activation process is performed after a plurality of doped regions is formed. Non-transparent material 82 is formed in DTI 86 after doped layer 84 is formed.

Figure 30:
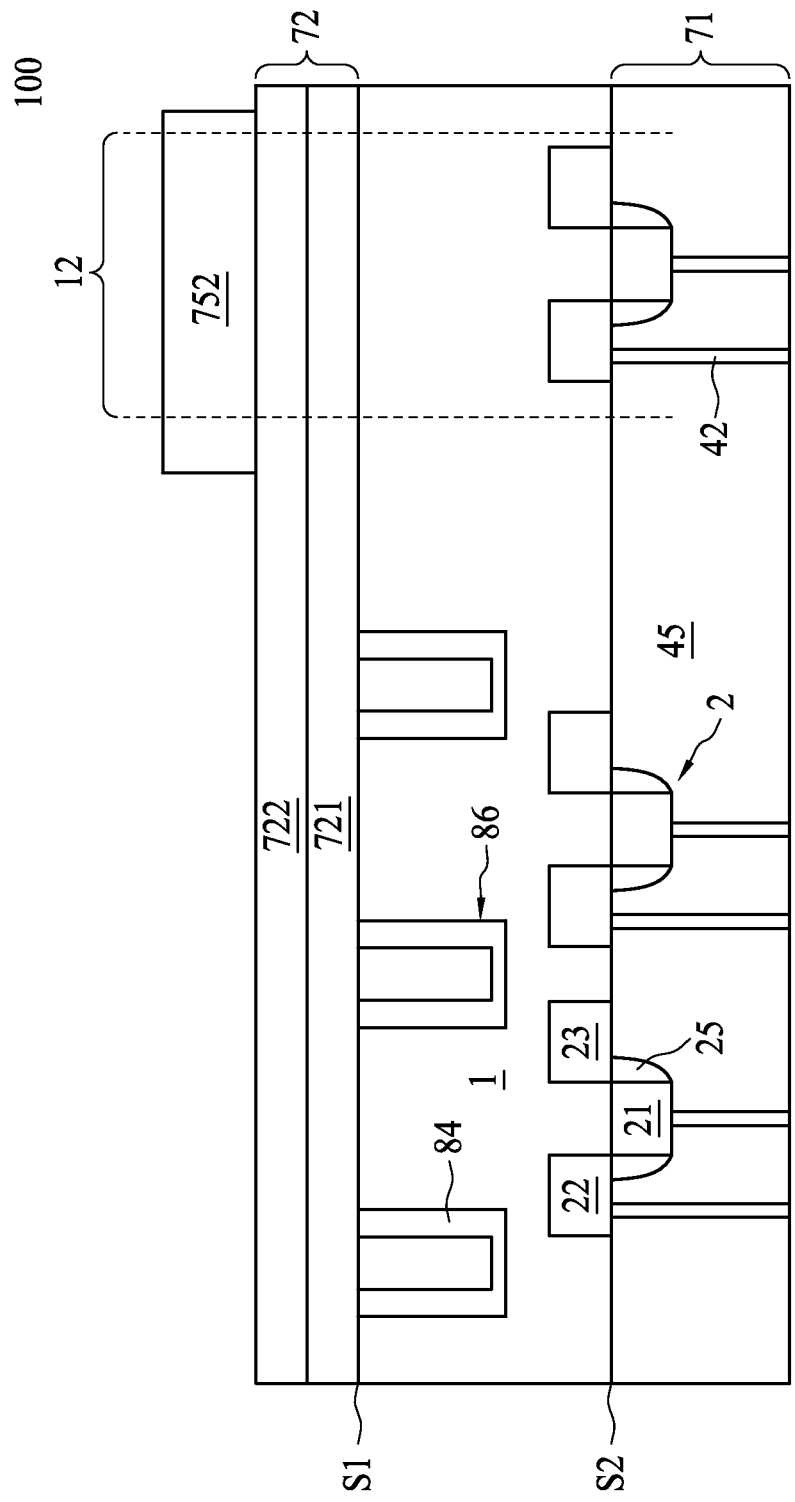

FIG. 30 is an exemplary embodiment for FIG. 2. In some embodiments, FIG. 30 is following the embodiment from FIG. 25. In FIG. 30, the multilayer structure 72 is formed on top of the back side S1. The first transmitting layer 721 and the second transmitting layer 722 are formed sequentially by the deposition processes such as CVD, PECVD, or other suitable methods. Light shielding layer 752 is formed on top of multilayer structure 72 by depositing and patterning light shielding layer 752. The light shielding layer 752 is formed by the deposition process including depositing a metal layer (or a layer of another opaque material) over the second transmitting layer 722. The deposited layer is etched to leave the light shielding layer 752 in a region corresponding to the black level reference pixels 19.

In FIG. 31, black level reference pixels 19 is formed by forming the light shielding layer 752 on the second transmitting layer 722. The capping layer 723 is blanket formed over the light shielding layer 752 and the second transmitting layer 722. In some embodiments, capping layer 723 is a passivation layer.

A color resist 742 is formed over the multilayer structure 72. The color resist 742 is for allowing a light with a color red, green, or blue to pass through. The color resist 742 is formed by any suitable process such as a deposition process. The deposition process may be spin-on coating, chemical vapor deposition (CVD), physical vapor deposition (PVD), atomic layer deposition (ALD), or combination thereof.

A suitable process such as photolithography is performed on the color resist 742. In photolithography the color resist 742 is exposed through a photomask 37. A photomask 37 is patterned to include a region 38. The region 38 forms a pattern over a portion 732 of color resist 742 in pixel region 18. The DTI 86 serves to define the boundary for each pixel region 17 or 18 of different color. The photomask 37 is placed over the color resist 742 to allow ultraviolet (UV) light 39 reaching to portion 732 of the color resist 742 under the region 38. The color resist 742 is photosensitive. To make the pattern insoluble, the portion 732 is UV cured by exposure through region 38 of photomask 37. Other soluble portions of the color resist 742 are removed by a developing solution. The pattern is cured through baking. The portion 732 is hardened, insoluble and remained on top of the multilayer structure 72 after baking.

In FIG. 32, the portion 732 remained is a color filter 732. The color filter 732 is aligned within the pixel region 18. Capping layer 723 at other region such as pixel region 17 is exposed.

In FIG. 33, a color filter 731 and a color filter 733 are formed sequentially by a similar operation as the operation for forming the color filter 732, except that a different color resist is used. The different color resist is patterned to dispose at a different pixel region such as pixel region 41. The color filter 731 is disposed within pixel 17 adjacent to the color filter 732. Color filters 733 are neighboring with the color filter 732 and the color filter 731.

Color filter array 73 is formed over the capping layer 723. In some embodiments, the color filter array 73 is formed by some suitable method such as a pigment diffusion method using a color resist. In some other embodiments, the color filter array 73 is formed by pigment diffusion method using etching method, dyeing method, or combination thereof.

Some embodiments of the present disclosure provide a method of manufacturing a back side illuminated (BSI) image sensor. The method includes receiving a semiconductive substrate; forming a transistor coupled to a photosensitive element at a front side of the semiconductive substrate; forming a deep trench isolation (DTI) at a back side of the semiconductive substrate; forming a doped layer conformally over the DTI; performing a microwave anneal over the back side; forming a non-transparent material inside the DTI; and forming a color filter over the doped layer.

Some embodiments of the present disclosure provide a method of manufacturing a back side illuminated (BSI) image sensor. The method includes receiving a semiconductive substrate; forming a transistor coupled to a photosensitive element at a front side of the semiconductive substrate; forming an interconnection coupled to the transistor; forming a deep trench isolation (DTI) at a back side of the semiconductive substrate; forming a doped layer conformally inside the DTI and over the semiconductive substrate; performing a microwave anneal over the doped layer; filling a conductive material inside the DTI; and forming a color filter over the doped layer.

Some embodiments of the present disclosure provide a back side illuminated (BSI) image sensor. The BSI image sensor includes a semiconductive substrate; a deep trench isolation (DTI) at a back side of the semiconductive substrate; a pixel region bounded by the deep trench isolations; a doped layer over the back side and in contact with a side of the DTI; a non-transparent material in the DTI; a transistor connected with a photosensitive element at a front side of the semiconductive substrate; an interconnection coupled with the transistor through a contact; an interlayer dielectric layer comprising the contact; and a color filter disposed at the back side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a back side illuminated (BSI) image sensor, comprising:
   receiving a semiconductive substrate;
   forming a transistor coupled to a photosensitive element at a front side of the semiconductive substrate;
   forming a deep trench isolation (DTI) at a back side of the semiconductive substrate;
   forming a doped layer conformally over the DTI;
   performing a microwave anneal over the back side;
   forming a non-transparent material inside the DTI; and
   forming a color filter over the doped layer;
   wherein the operation of performing the microwave anneal includes forming the doped layer to a predetermined vertical thickness.

2. The method of claim 1, further comprising forming a dielectric layer conformally over the doped layer.

3. The method of claim 1, wherein the operation of forming the doped layer comprises doping a p-type dopant or an n-type dopant in a variable concentration profile.

4. The method of claim 1, wherein the operation of forming the DTI comprises etching the back side of the semiconductive substrate.

5. The method of claim 1, wherein the operation of forming the doped layer comprises using an ion implantation.

6. A method of manufacturing a back side illuminated (BSI) image sensor, comprising:
    receiving a semiconductive substrate;
    forming a transistor coupled to a photosensitive element at a front side of the semiconductive substrate;
    forming an interconnection coupled to the transistor;
    forming a deep trench isolation (DTI) at a back side of the semiconductive substrate;
    forming a doped layer conformally inside the DTI and over the semiconductive substrate;
    performing a microwave anneal over the doped layer;
    filling a conductive material inside the DTI; and
    forming a color filter over the doped layer;
    wherein the operation of performing the microwave anneal includes forming the doped layer to a predetermined vertical thickness.

7. The method of claim 6, further comprising forming a polarized dielectric layer conformally over the doped layer.

8. The method of claim 6, wherein the operation of forming the doped layer comprises using an n-type dopant or a p-type dopant.

9. The method of claim 6, wherein the operation of forming the doped layer comprises epitaxially growing the doped layer in the DTI and over the back side.

10. The method of claim 6, wherein the operation of forming the DTI comprises dry etching the back side of the semiconductive substrate.

11. A method of forming a deep trench isolation (DTI) in a back side illuminated (BSI) image sensor, comprising:
    receiving a semiconductive substrate;
    forming a deep trench at a back side of the semiconductive substrate;
    forming a doped layer conformally over the deep trench;
    performing low temperature activation to active dopants in the doped layer;
    forming a non-transparent material inside the deep trench; and
    forming a color filter over the doped layer;
    wherein the operation of performing low temperature activation to active the dopants in the doped layer comprises performing a microwave anneal over the back side to active the dopants in the doped layer.

12. The method of claim 11, further comprising forming a dielectric layer conformally over the doped layer.

13. The method of claim 11, wherein the operation of forming the doped layer comprises doping a p-type dopants or an n-type dopants in a variable concentration profile.

14. The method of claim 13, wherein the doped layer comprises the p-type dopants and the n-type dopants.

15. The method of claim 11, wherein the operation of forming the deep trench comprises etching the back side of the semiconductive substrate.

16. The method of claim 11, wherein the operation of forming the doped layer comprises using an ion implantation.

17. The method of claim 11, wherein the operation of forming the doped layer comprises epitaxially growing the doped layer in the DTI and over the back side.

18. The method of claim 11, wherein the operation of performing the microwave anneal comprises forming the doped layer to a predetermined vertical thickness.

* * * * *